United States Patent
Guo et al.

(10) Patent No.: US 11,955,184 B2
(45) Date of Patent: Apr. 9, 2024

(54) MEMORY CELL GROUP READ WITH COMPENSATION FOR DIFFERENT PROGRAMMING SPEEDS

(71) Applicant: SanDisk Technologies LLC, Addison, TX (US)

(72) Inventors: Jiacen Guo, Sunnyvale, CA (US); Xiaochen Zhu, Milpitas, CA (US); Xiang Yang, Santa Clara, CA (US); Lito De La Rama, San Jose, CA (US); Yi Song, San Jose, CA (US); Jiahui Yuan, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 98 days.

(21) Appl. No.: 17/740,429

(22) Filed: May 10, 2022

(65) Prior Publication Data
US 2023/0368846 A1 Nov. 16, 2023

(51) Int. Cl.
*G11C 16/28* (2006.01)
*G11C 16/04* (2006.01)
*G11C 16/10* (2006.01)
*G11C 16/34* (2006.01)

(52) U.S. Cl.
CPC .......... *G11C 16/28* (2013.01); *G11C 16/0483* (2013.01); *G11C 16/10* (2013.01); *G11C 16/3459* (2013.01)

(58) Field of Classification Search
CPC ..... G11C 16/28; G11C 16/0483; G11C 16/10; G11C 16/3459
See application file for complete search history.

(56) References Cited

U.S. PATENT DOCUMENTS

| | | | |
|---|---|---|---|
| 5,659,505 A | * | 8/1997 | Kobayashi ............ H01L 27/105 257/E27.081 |
| 8,892,626 B2 | | 11/2014 | Kakivaya et al. |
| 8,902,661 B1 | | 12/2014 | Raghu et al. |
| 9,015,407 B1 | | 4/2015 | Dusija et al. |
| 9,812,462 B1 | | 11/2017 | Pang et al. |

(Continued)

FOREIGN PATENT DOCUMENTS

WO 2015038558 A1 3/2015

OTHER PUBLICATIONS

U.S. Appl. No. 17/392,500, filed Aug. 3, 2021.
U.S. Appl. No. 17/484,218, filed Sep. 24, 2021.

*Primary Examiner* — Vanthu T Nguyen
(74) *Attorney, Agent, or Firm* — Vierra Magen Marcus LLP

(57) ABSTRACT

Technology is disclosed herein for a memory system that compensates for different programming speeds in two sets of memory cells when reading those two sets of memory cells. The memory system programs a group of the memory cells to one or more data states. In one aspect, the memory cells are not verified during programming. The group has a first set of memory cells that program at a first speed and a second set of memory cells that program at a second speed. The memory system reads the first set of the memory cells with a first set of read parameters and reads the second set of the memory cells with a second set of read parameters. The first set of read parameters are different from the second set of read parameters to compensate for the different programming speeds.

20 Claims, 19 Drawing Sheets

(56) References Cited

U.S. PATENT DOCUMENTS

| | | |
|---|---|---|
| 9,959,932 B1 | 5/2018 | Zhang et al. |
| 10,541,031 B2 * | 1/2020 | Dunga .................. G11C 16/24 |
| 10,930,355 B2 | 2/2021 | Yang et al. |
| 2010/0142284 A1 | 6/2010 | Bathul et al. |
| 2010/0220510 A1 | 9/2010 | Shalvi |
| 2014/0056069 A1 * | 2/2014 | Park ...................... G11C 16/24 |
| | | 365/185.25 |
| 2014/0298088 A1 | 10/2014 | Radke et al. |
| 2019/0035474 A1 | 1/2019 | Tassan et al. |
| 2020/0365218 A1 | 11/2020 | Yang |

* cited by examiner

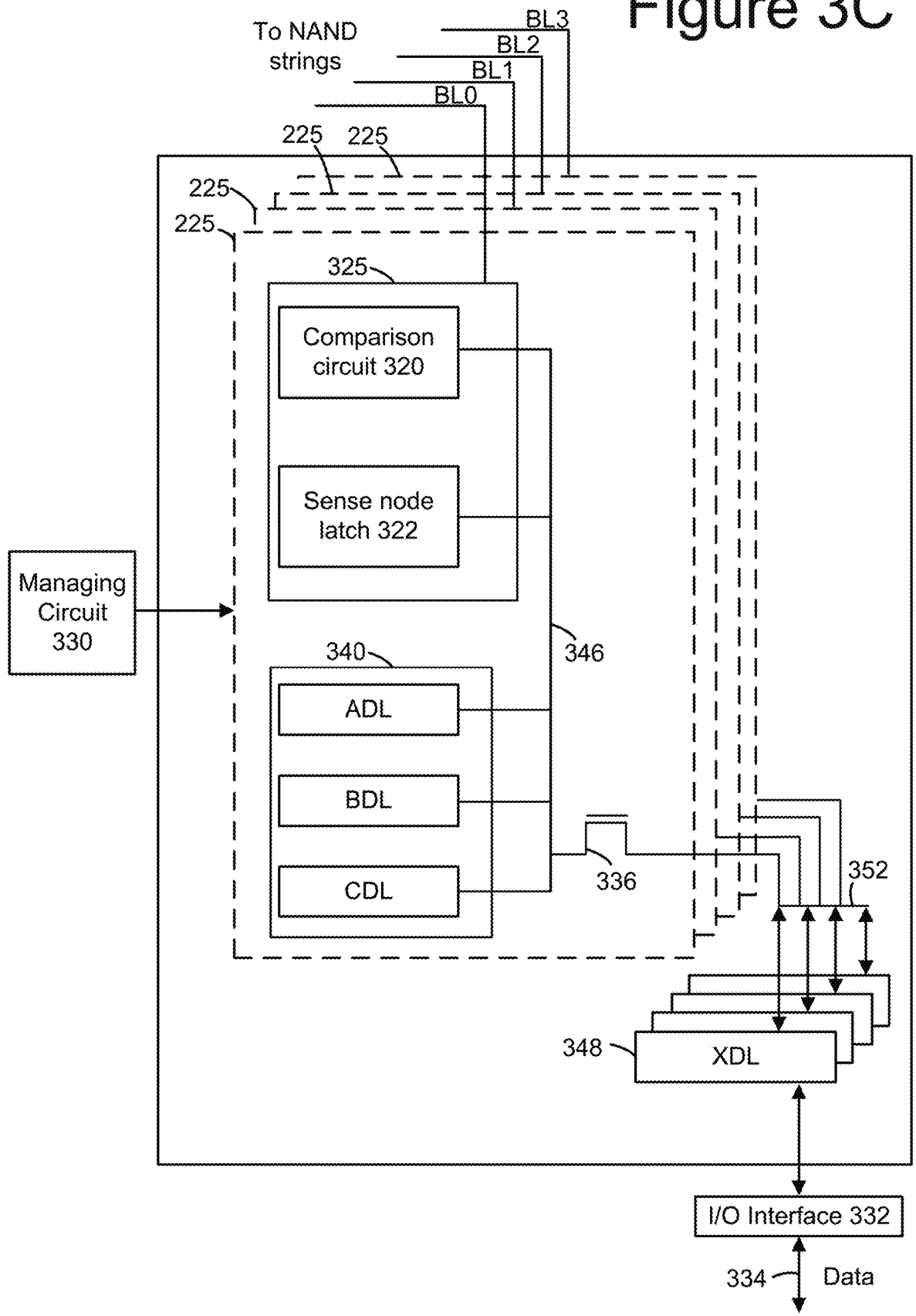

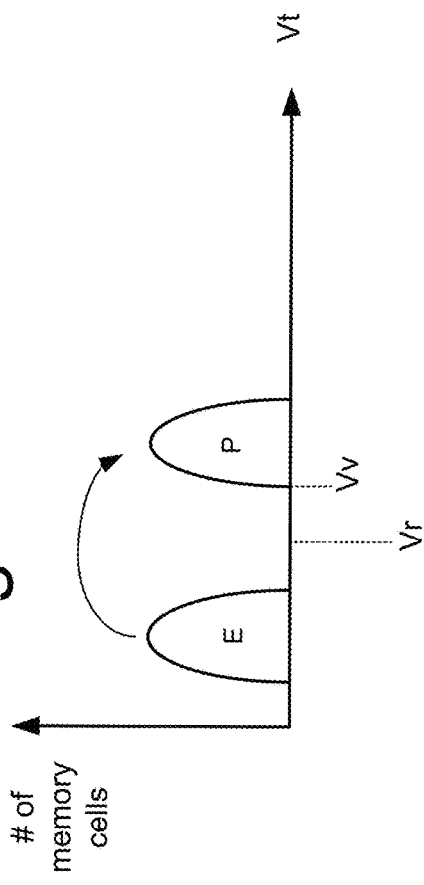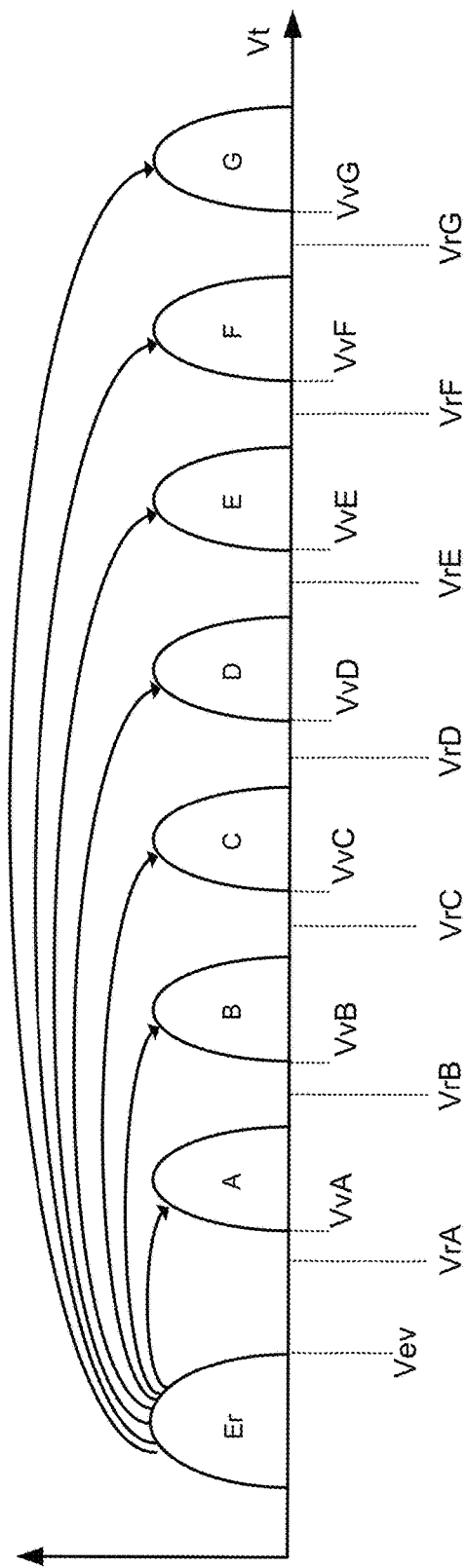
Figure 5A
Figure 5B

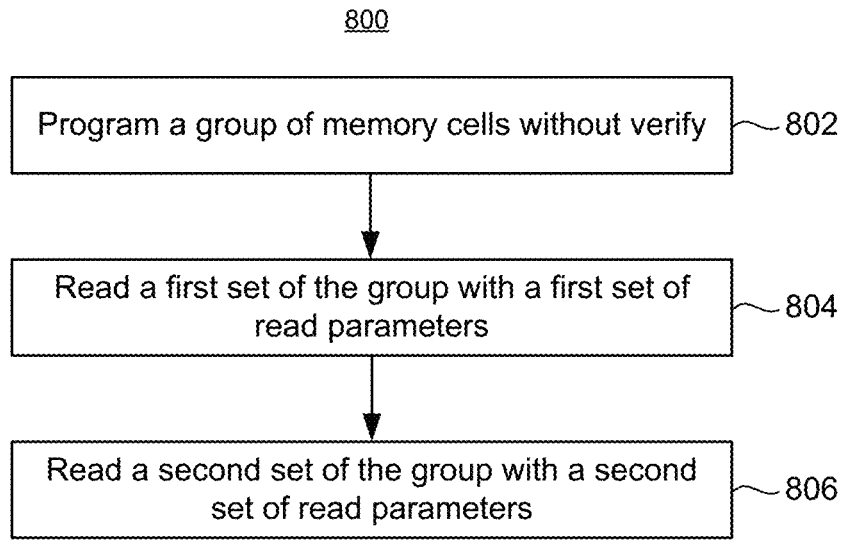
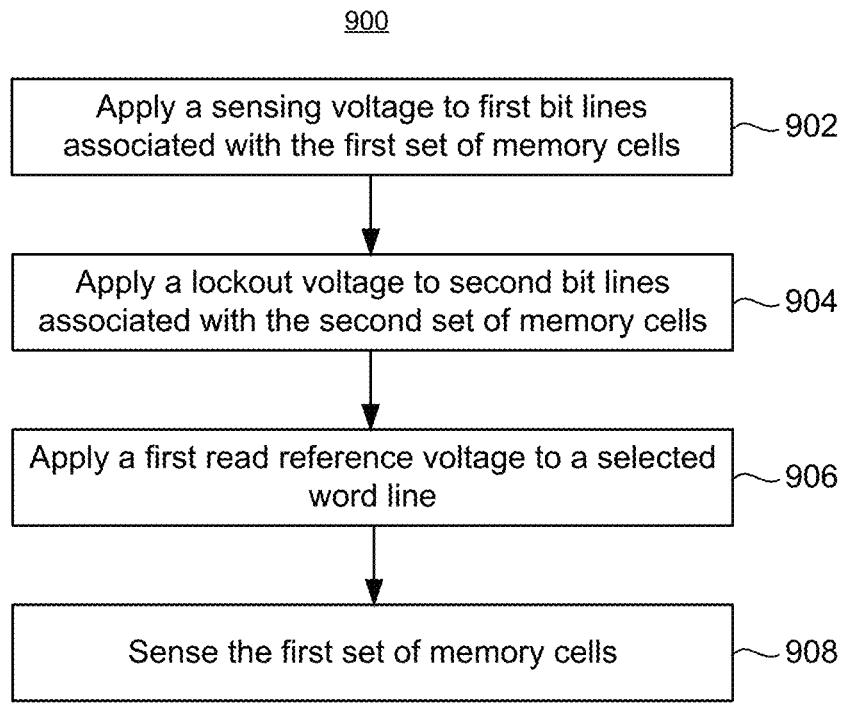

MEMORY CELL GROUP READ WITH COMPENSATION FOR DIFFERENT PROGRAMMING SPEEDS

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be three-dimensional. One type of three-dimensional structure has non-volatile memory cells arranged as vertical NAND strings. The memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block.

The non-volatile memory cells may be programmed to store data. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

To read the data back from the memory cells it is typical to use read reference voltages in order to determine what data state a memory cell is presently in. If the Vt of a memory cell is at or below the read reference voltage, the memory cell will conduct a significant current. If the Vt of the memory cell is above the read reference voltage, the memory cell will not conduct a significant current.

The semiconductor fabrication process for forming a three-dimensional memory structure may result in physical differences between the memory cells, which may result in differences in operational characteristics between the memory cells. One type of three-dimensional memory structure has alternating dielectric layers and conductive layers in a stack. NAND strings are formed vertically in the alternating dielectric layers and conductive layers in what may be referred to as memory holes. For example, after memory holes are drilled into the stack of alternating dielectric layers and conductive layers, the memory holes are filled in with materials including a charge-trapping material to create a vertical column of memory cells (e.g., NAND string).

BRIEF DESCRIPTION OF THE DRAWINGS

Like-numbered elements refer to common components in the different figures.

FIG. 3C is a block diagram depicting one embodiment of a portion of column control circuitry that contains a number of read/write circuits.

FIGS. 5A and 5B depicts threshold voltage distributions.

FIG. 8 is a flowchart of one embodiment of a process of programming and reading a group of memory cells.

FIG. 9 is a flowchart of one embodiment of a process of reading a first set of memory cells using a reference voltage while locking out a second set of memory cells.

DETAILED DESCRIPTION

Figure 1:
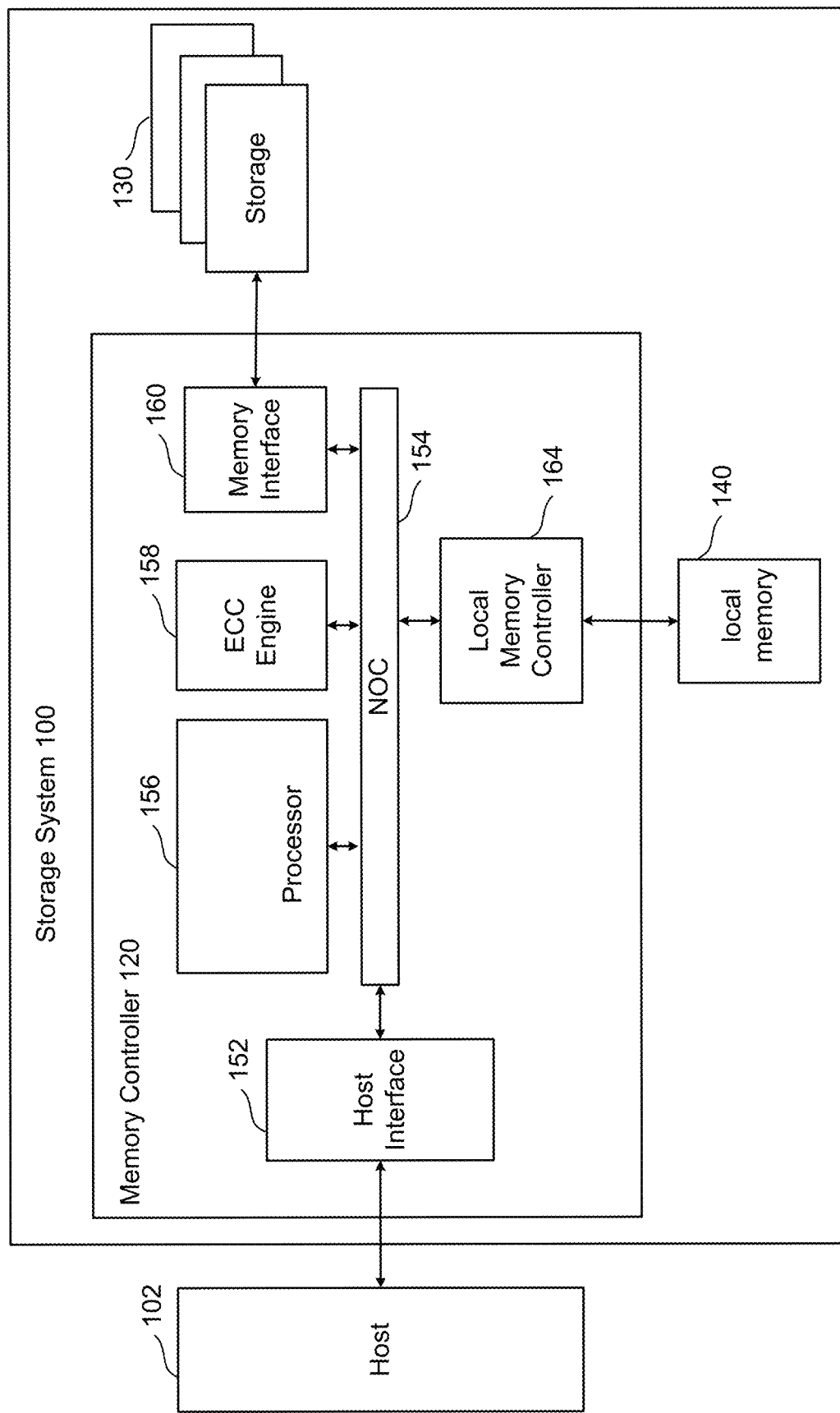
FIG. 1 is a block diagram depicting one embodiment of a storage system.

Technology is disclosed herein for a memory system that compensates for different programming speeds in two sets of memory cells when reading those two sets of memory cells. In one embodiments, the memory cells reside in a three-dimensional memory structure having NAND strings. The memory system programs a group of the memory cells to one or more data states. In an embodiment, the memory cells are not verified during programming. In an embodiment, the group has a first set of memory cells that program at a first speed and a second set of memory cells that program at a second speed. Memory cells in one set on average exhibit a greater increase in Vt for each program pulse than cells in the other set. Memory cells that exhibit a greater increase in Vt for each program pulse are referred to herein as faster programming, whereas memory cells that exhibit a lesser increase in Vt for each program pulse are referred to herein as slower programming. The memory system reads the first set of the memory cells with a first set of read parameters and reads the second set of the memory cells with a second set of read parameters. The first set of read parameters are different from the second set of read parameters to compensate for the different programming speeds. The set of read parameters includes, but is not limited to, a read reference voltage, a sensing time, and a bit line voltage. The phrase "a first set of read parameters is different from the second set of read parameters" means that the value of at least one parameter in the set is different between the two sets of read parameters.

In one embodiment, the first set of read parameters comprises a first read reference voltage that is applied to a selected word line and the second set of read parameters comprises a second read reference voltage that is applied to the selected word line. The second read reference voltage has a different magnitude than the first read reference voltage to compensate for the different programming speeds.

In one embodiment, the first set of read parameters comprises a first sense time for sensing a conduction current of respective memory cells in the first set and the second set of read parameters comprises a second sense time for sensing a conduction current of respective memory cells in the second set. The second sense time has a different duration than the first sense time to compensate for the different programming speeds.

In one embodiment, the first set of read parameters comprises a first bit line voltage for first bit lines associated with first NAND strings having the first set of memory cells and the second set of read parameters comprises a second bit line voltage for second bit lines associated with second NAND strings having the second set of memory cells. The second bit line voltage has a different magnitude than the first bit line voltage to compensate for the different programming speeds. In an embodiment, the second bit line voltage creates drain induced barrier lowering (DIBL) in the second set of memory cells.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
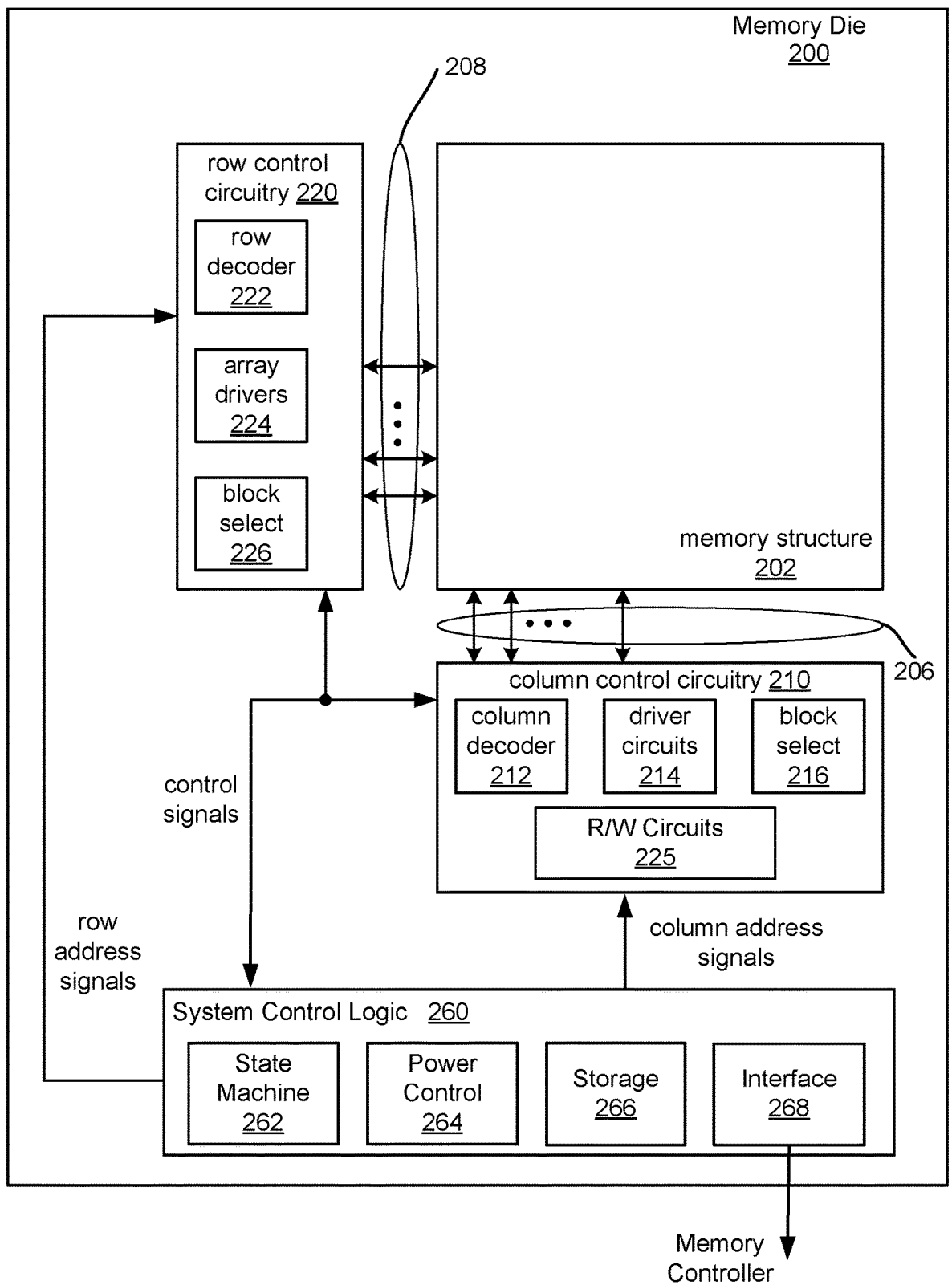
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
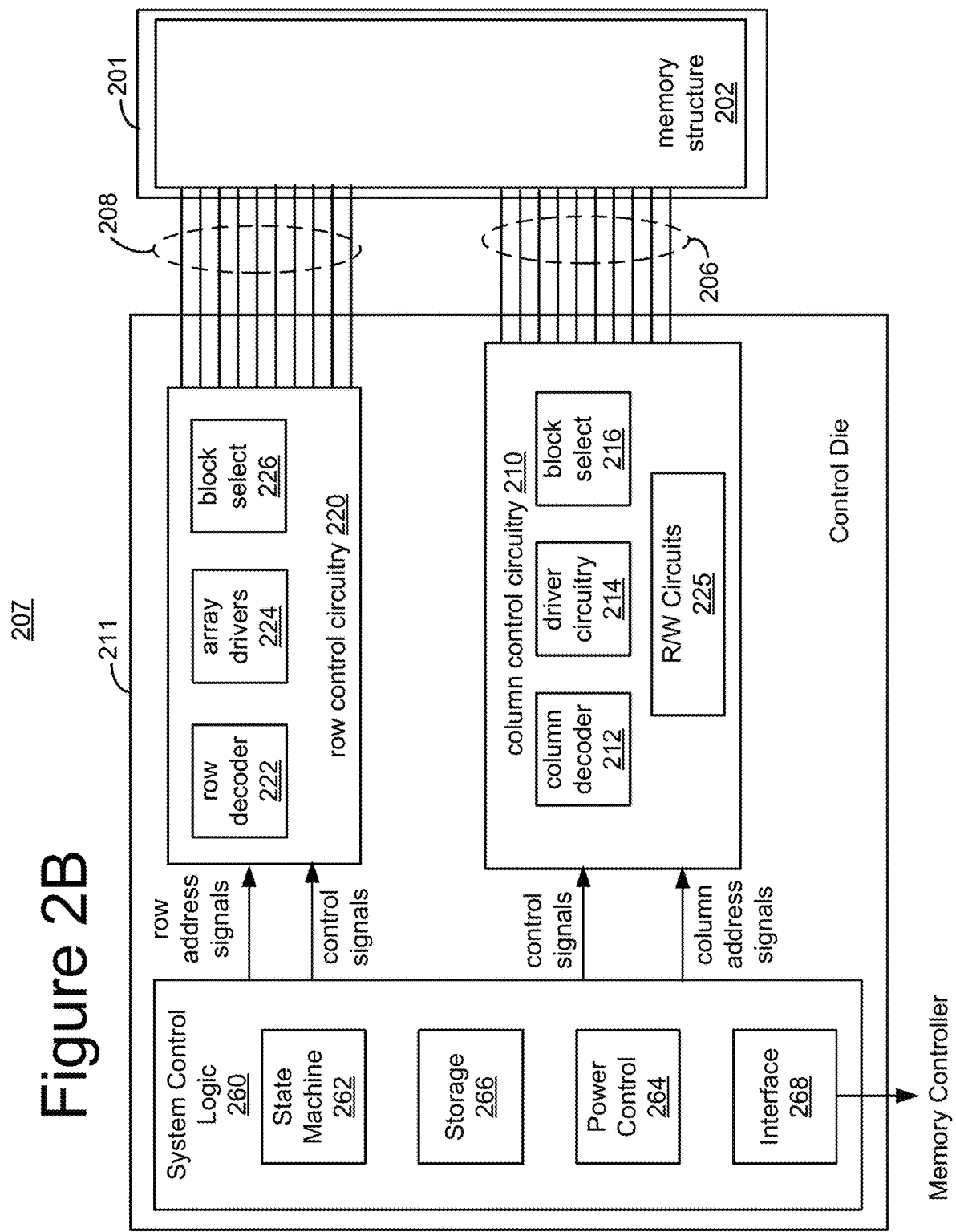
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3A:
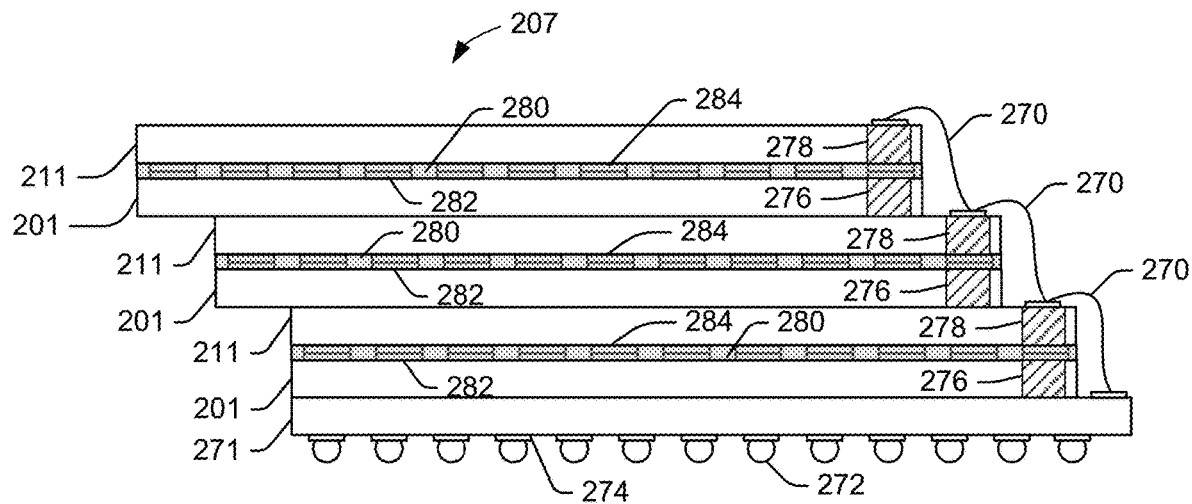
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control die 211 and multiple memory structure die 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
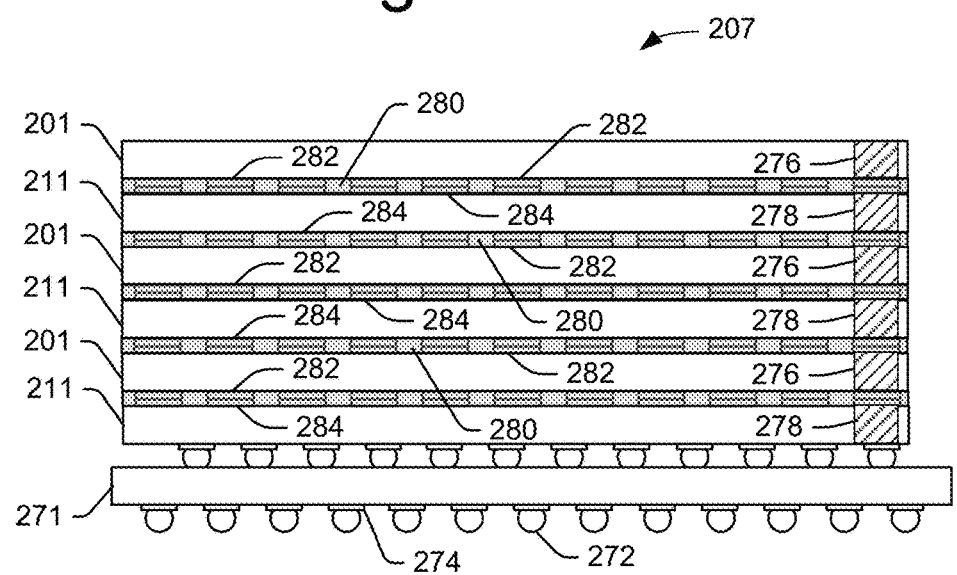

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

FIG. 3C is a block diagram depicting one embodiment of a portion of column control circuitry 210 that contains a number of read/write circuits 225. Each read/write circuit 225 is partitioned into a plurality of sense amplifiers 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time. In some embodiments, the length of the sensing time is controlled to compensate for different programming speeds of memory cells in different regions of, for example, a sub-block.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells has been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate. However, in some embodiments, verify is not performed. If verify is not performed, memory cells may still be locked out after a pre-determined number of pulse have been applied to the cell given the target data state.

Figure 4:
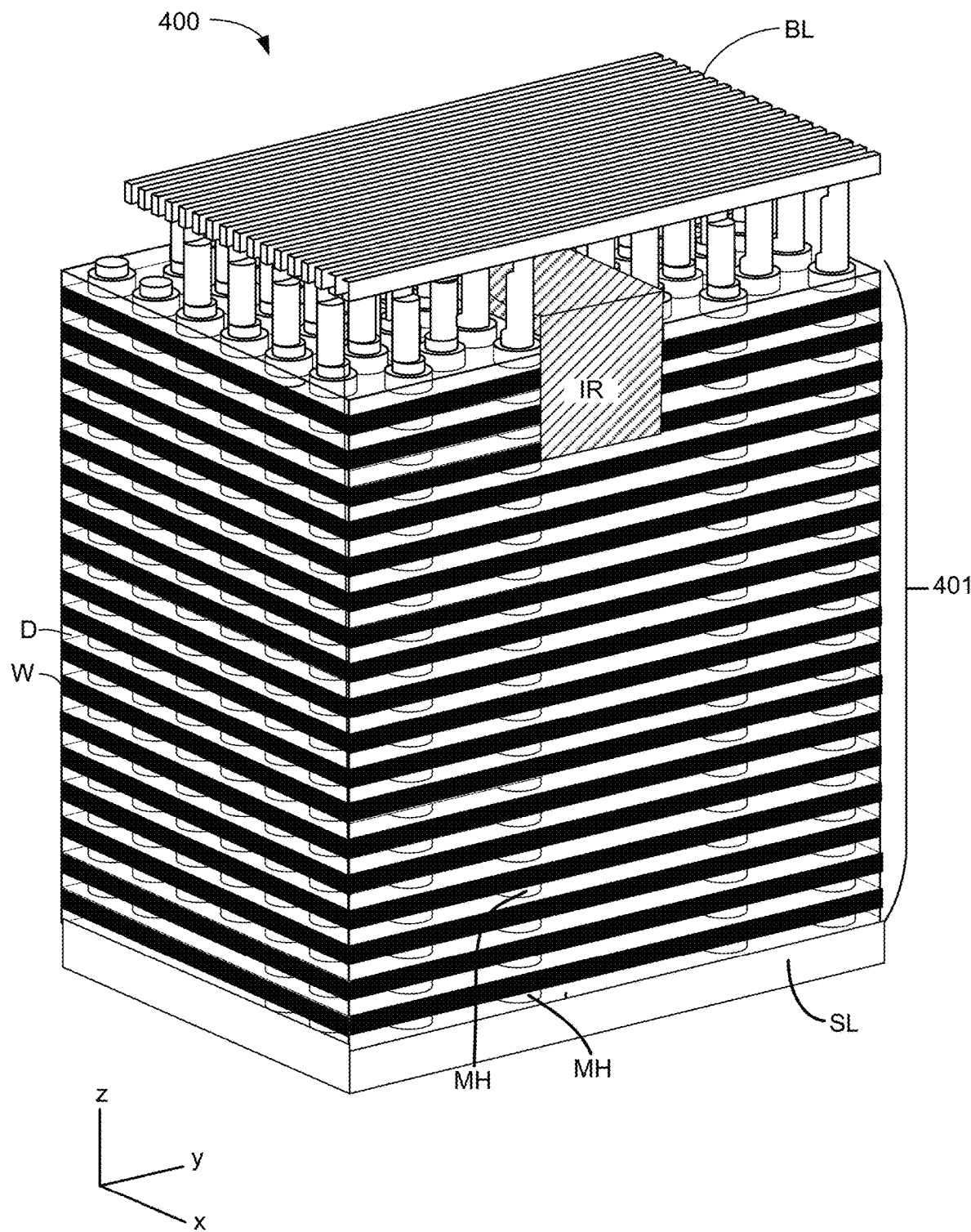
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
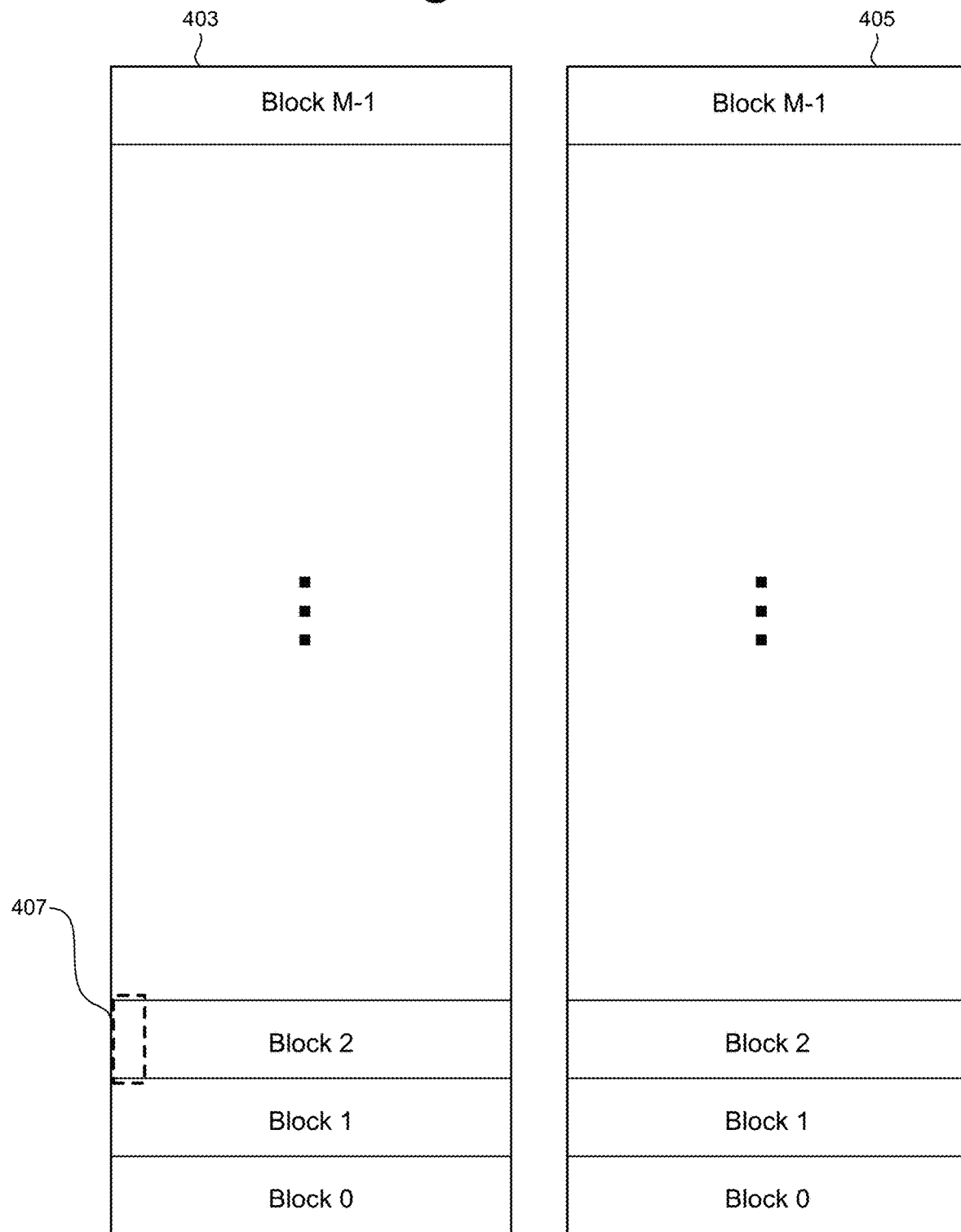
FIG. 4A is a block diagram of one embodiment of a memory structure having two planes.

FIG. 4A is a block diagram explaining one example organization of memory structure 202, which is divided into two planes 403 and 405. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
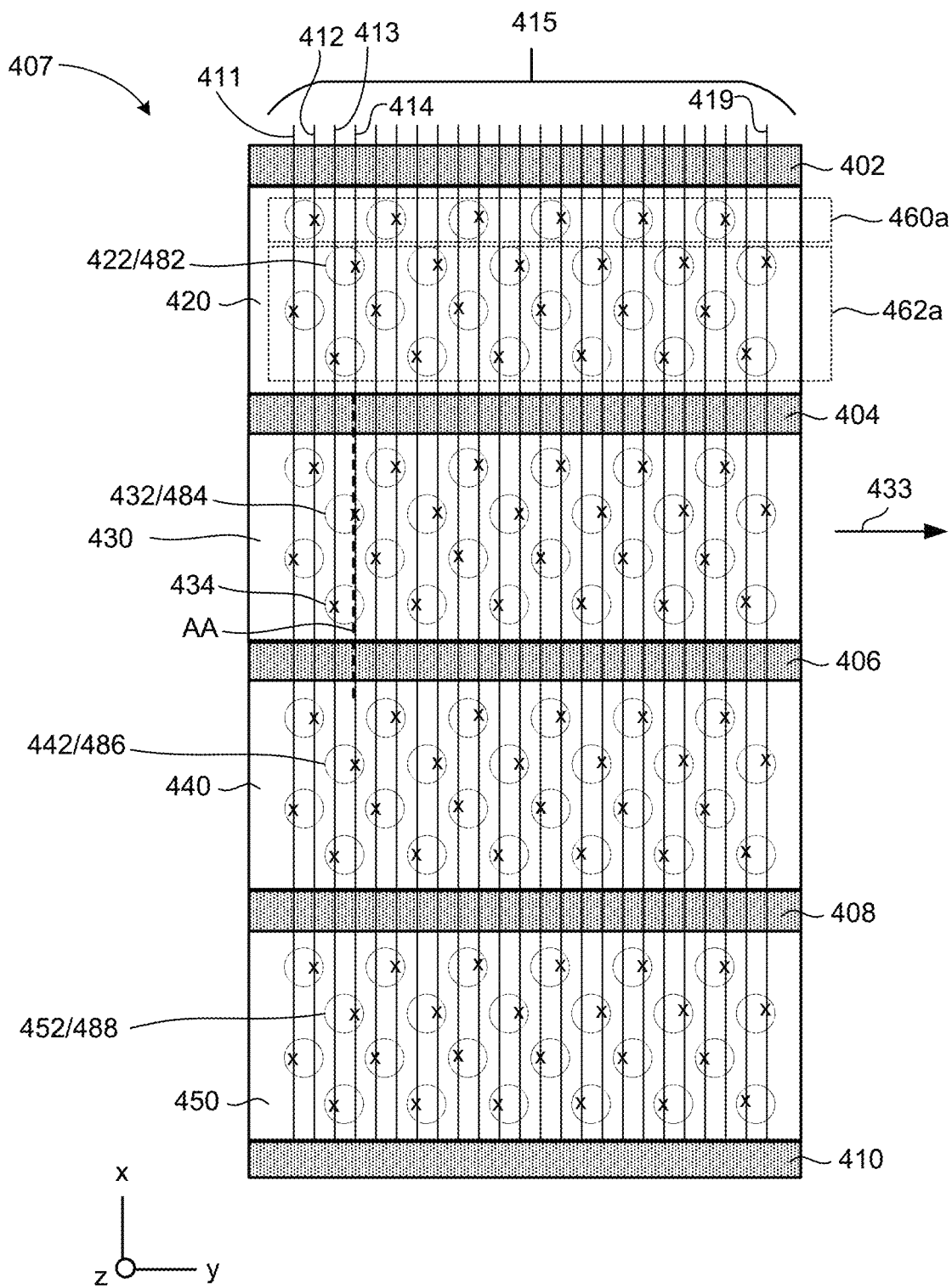
FIG. 4B is a block diagram depicting a top view of a portion of block of memory cells.

FIGS. 4B-4F depict an example three dimensional ("3D") NAND structure that corresponds to the structure of FIG. 4 and can be used to implement memory structure 202 of FIGS. 2A and 2B. FIG. 4B is a block diagram depicting a top view of a portion 407 of Block 2. As can be seen from FIG. 4B, the block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 433, the block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of isolation regions 402, 404, 406, 408 and 410, which are formed of $SiO_2$; however, other dielectric materials can also be used. Isolation regions 402, 404, 406, 408 and 410 serve to divide the top layers of the block into four regions; for example, the top layer depicted in FIG. 4B is divided into regions 420, 430, 440, and 450 of which are referred to as sub-blocks. In one embodiment, isolation regions 402 and 410 separate the block 407 from adjacent blocks. Thus, isolation regions 402 and 410 may extend down to the substrate. In one embodiment, the isolation regions 430, 440, and 450 only divide the layers used to implement select gates so that NAND strings in different sub-blocks can be independently selected. Referring back to FIG. 4, the IR region may correspond to any of isolation regions 404, 406, or 408. In one example implementation, a bit line only connects to one vertical column/ NAND string in each of regions (sub-blocks) 420, 430, 440, and 450. In that implementation, each block has twenty four rows of active columns and each bit line connects to four rows in each block. In one embodiment, all of the four vertical columns/NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Region 460a and 462a are depicted in sub-block 420 FIG. 4B. These regions 460b, 462b are part of the same drain side select line. Region 460a contains a row of memory holes that are adjacent to isolation region 402. Region 462a contains three rows of memory holes that are also in sub-block 420, but are further from isolation region 402. At the top layer, sub-block 420 comprises a first drain side select line for selecting sub-block 420, sub-block 440 comprises a second drain side select line for selecting sub-block 430, sub-block 440 comprises a third drain side select line for selecting sub-block 430, and sub-block 450 comprises a fourth drain side select line for selecting sub-block 450.

Figure 4C:
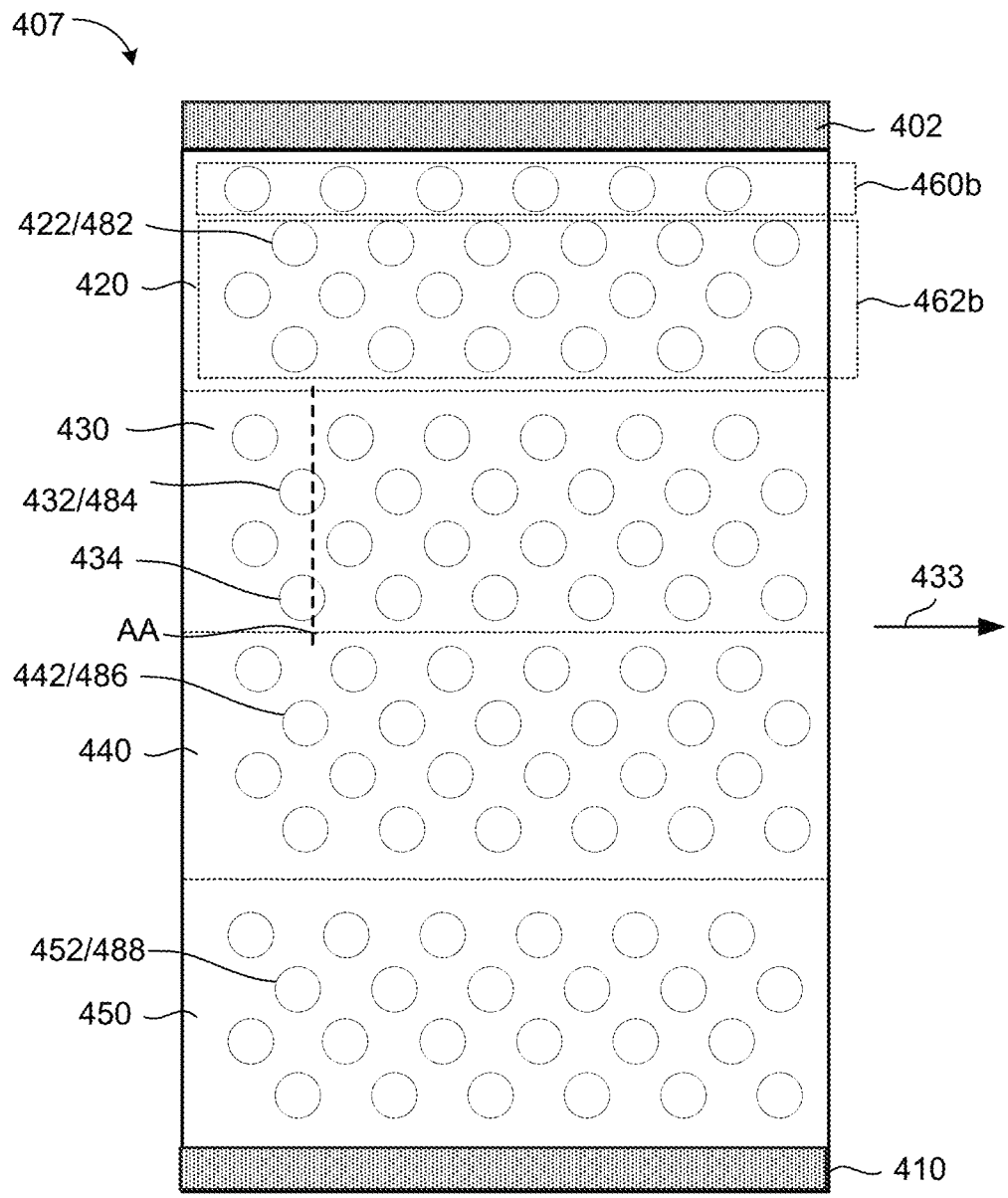
FIG. 4C depicts a view of a portion of a word line layer of the portion of block of memory cells in FIG. 4A.

FIG. 4C depicts a view of a portion of a word line layer of the portion 407 of Block 2. The portion of the block depicted in FIG. 4B corresponds to the portion depicted in FIG. 4A, but is at a word line layer. Thus, FIG. 4B shows regions 420, 430, 440, and 450, which are each a portion of one of the four sub-blocks. The dashed lines depicted between the regions 420, 430, 440, and 450 are shown to indicate the boundaries of the sub-blocks. Isolation regions 402 and 410 are depicted in FIG. 4C. However, the isolation regions 404, 406 and 408 that were depicted in FIG. 4A are not depicted in FIG. 4B, as in an embodiment those isolation regions 404, 406 and 408 do not extend down to the word line layer. Optionally, isolation regions 404, 406 and 408 may extend down to the word line layer. The vertical columns 422, 432, 442, and 452 depicted in FIG. 4B are continuations of the vertical columns 422, 432, 442, and 452 depicted in FIG. 4A. The NAND strings 482, 484, 486, and 488 depicted in FIG. 4B are continuations of the NAND strings 482, 484, 486, and 488 depicted in FIG. 4A.

In some embodiments, the process of manufacturing the 3D memory structure includes depositing alternating layers of silicon oxide and silicon nitride. The silicon oxide will serve as the dielectric layers. The silicon nitride is a sacrificial material that will eventually be replaced with tungsten (or another conductor) to serve as the word line layers. Prior to removing the silicon nitride, holes for the vertical columns 482, 484, 486, and 488 are drilled into the alternating layers of silicon oxide and silicon nitride. The holes may be filled with films to form the NAND strings 482, 484, 486, and 488. As noted above, the sacrificial silicon nitride layers are removed by an etchant. This leaves portions of the vertical columns 422, 432, 442, and 452 exposed where the silicon nitride was removed. Then, a block oxide such as aluminum oxide is deposited onto the outer surfaces of the vertical columns 422, 432, 442, and 452. In one embodiment, the isolation regions 402, 410 are open trenches at this time such that the aluminum oxide can be deposited by way of those trenches.

The fabrication process may result in different physical characteristics for the memory cells in different regions of the word line layer. Region 460b and 462b are depicted in FIG. 4B. Regions 460b and 462b correspond to regions 460a and 462a, respectively in FIG. 4A. Regions 460b, 462b are both in the same sub-block 420. Therefore, regions 460b 462b may be programmed at the same time. The memory cells in region 460b may have a different physical characteristic from the memory cells in region 462b, which may lead to different programming characteristics. For example, memory cells in region 460b may have worse circularity than memory cells in region 462b. Other physical characteristics that could differ include memory hole diameter and memory film thickness. Also, memory cells in region 460b may suffer more from process variation than memory cells in region 462b. In one embodiment, the memory cells in region 460b program at a different speed than the memory cells in region 462b. In some embodiments, different read parameters are used to read memory cells in region 460b than the read parameters used to read memory cells in region 462b. The different read parameters may compensate for the different programming speeds and/or the different physical characteristics of the memory cells. In one embodiment, memory cells closer to isolation region 402 (or 410) will program more slowly than memory cells further away from isolation region 402 (or 410). However, the location of the slower programming memory cells may depend on the fabrication process. In an embodiment, the memory system will store information that indicates what region(s) is/are slower programming (and/or faster programming).

Figure 4D:
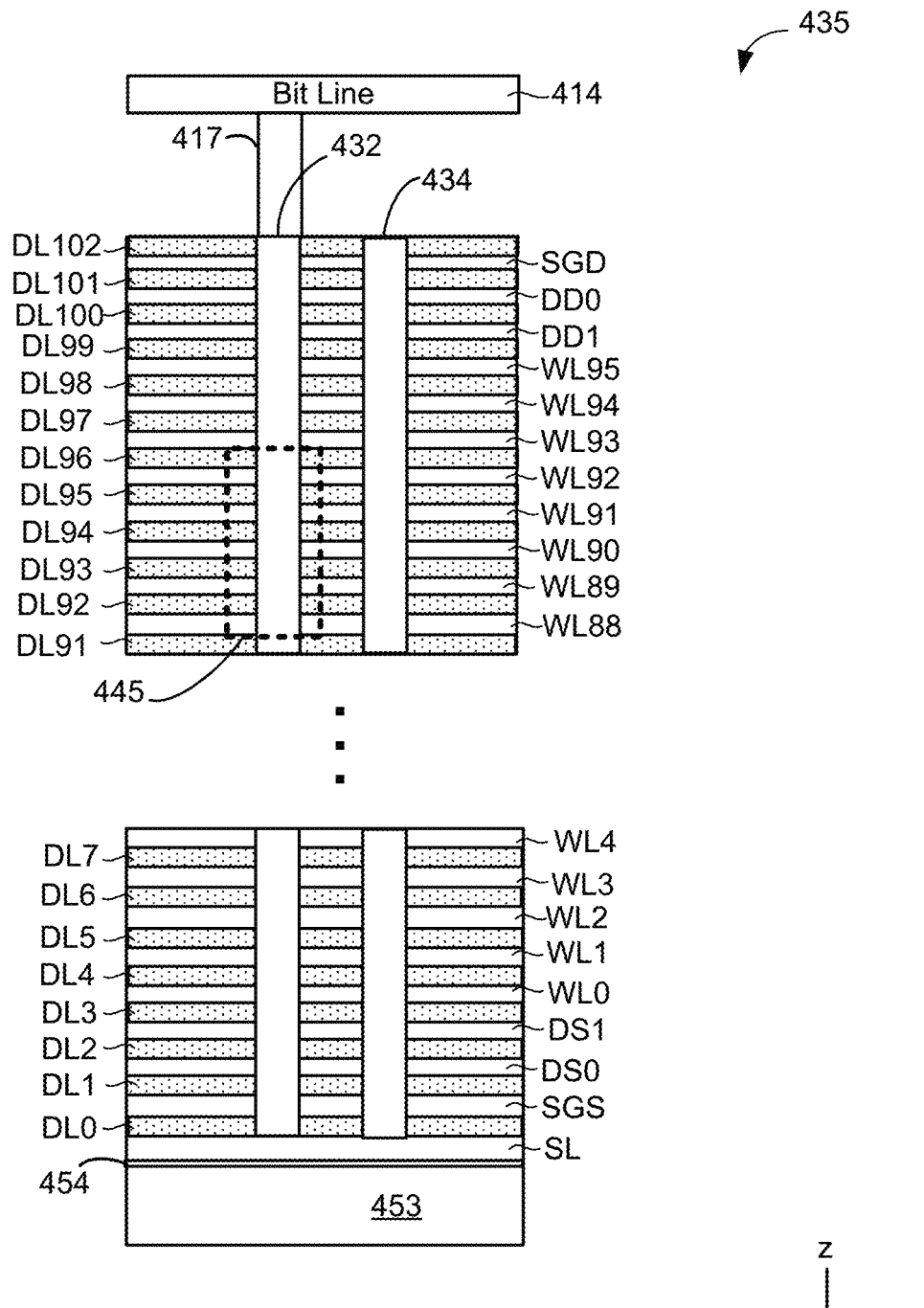
FIG. 4D depicts an embodiment of a stack showing a cross-sectional view along line AA of FIGS. 4A and 4B.

FIG. 4D depicts an embodiment of a stack 435 showing a cross-sectional view along line AA of FIGS. 4A and 4B. An SGD layer (SGD), an SGS layer (SGS) and four dummy word line layers DD0, DD1, DS1, and DS0 are provided, in addition to the data word line layers WL0-WL95. Each NAND string has a drain side select transistor at the SGD layer. Each NAND string has a source side select transistor at the SGS layer. There may be more than one SGD layer, as well as more than one SGS layer. Also depicted are dielectric layers DL0-DL102.

Columns 432, 434 of memory cells are depicted in the multi-layer stack. The stack includes a substrate 453, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL96 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layer SGD is used to electrically connect and disconnect (or cut off) the channels of respective NAND strings from bit lines. Source side select layer SGS is used to electrically connect and disconnect (or cut off) the channels of respective NAND strings from the source line SL.

Figure 4E:
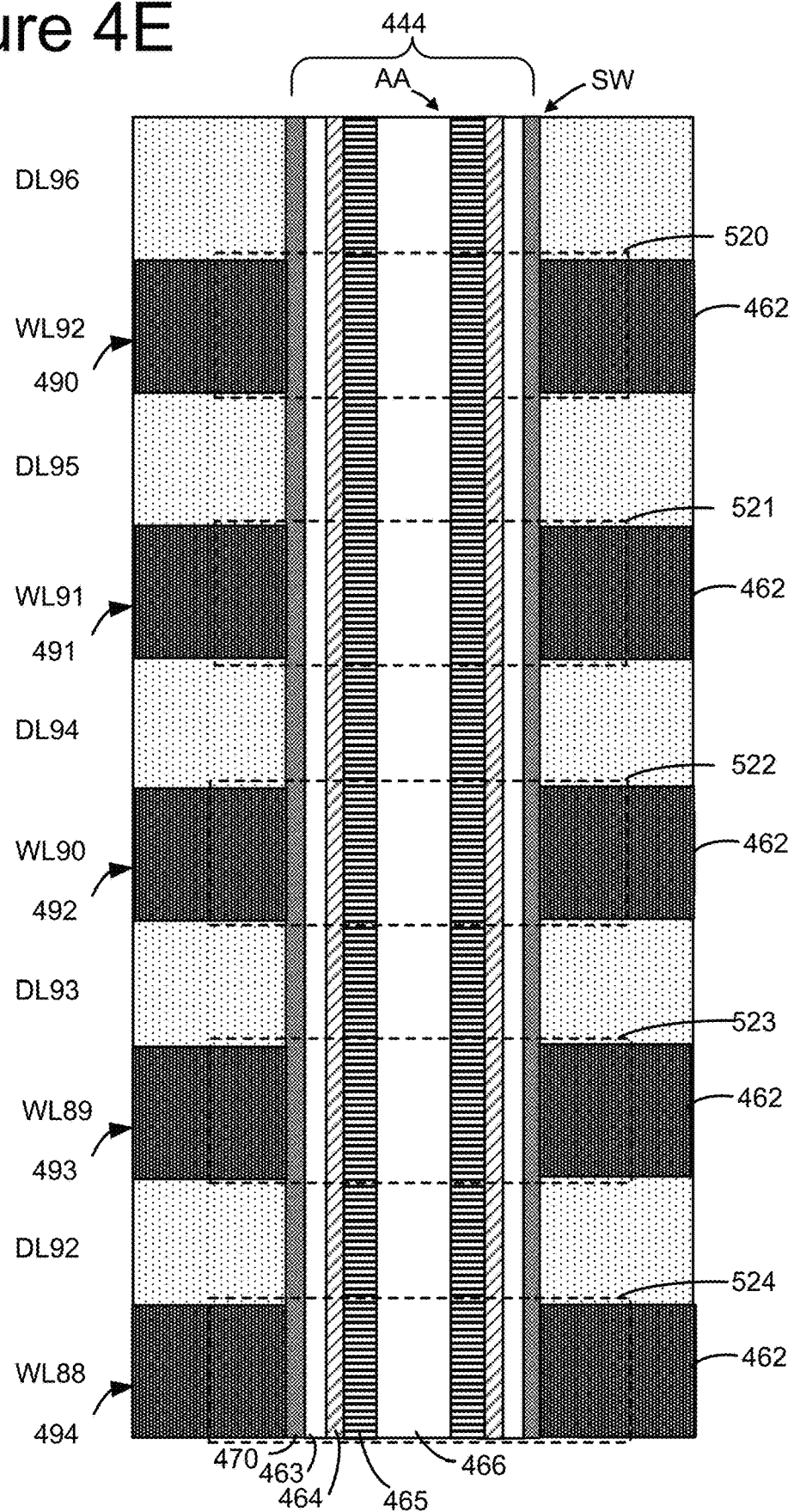
FIG. 4E depicts a view of the region 445 of FIG. 4D.

FIG. 4E depicts a view of the region 445 of FIG. 4D. Data memory cell transistors 520, 521, 522, 523, and 524 are indicated by the dashed lines. A number of layers can be deposited along the sidewall (SW) of the memory hole 444 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
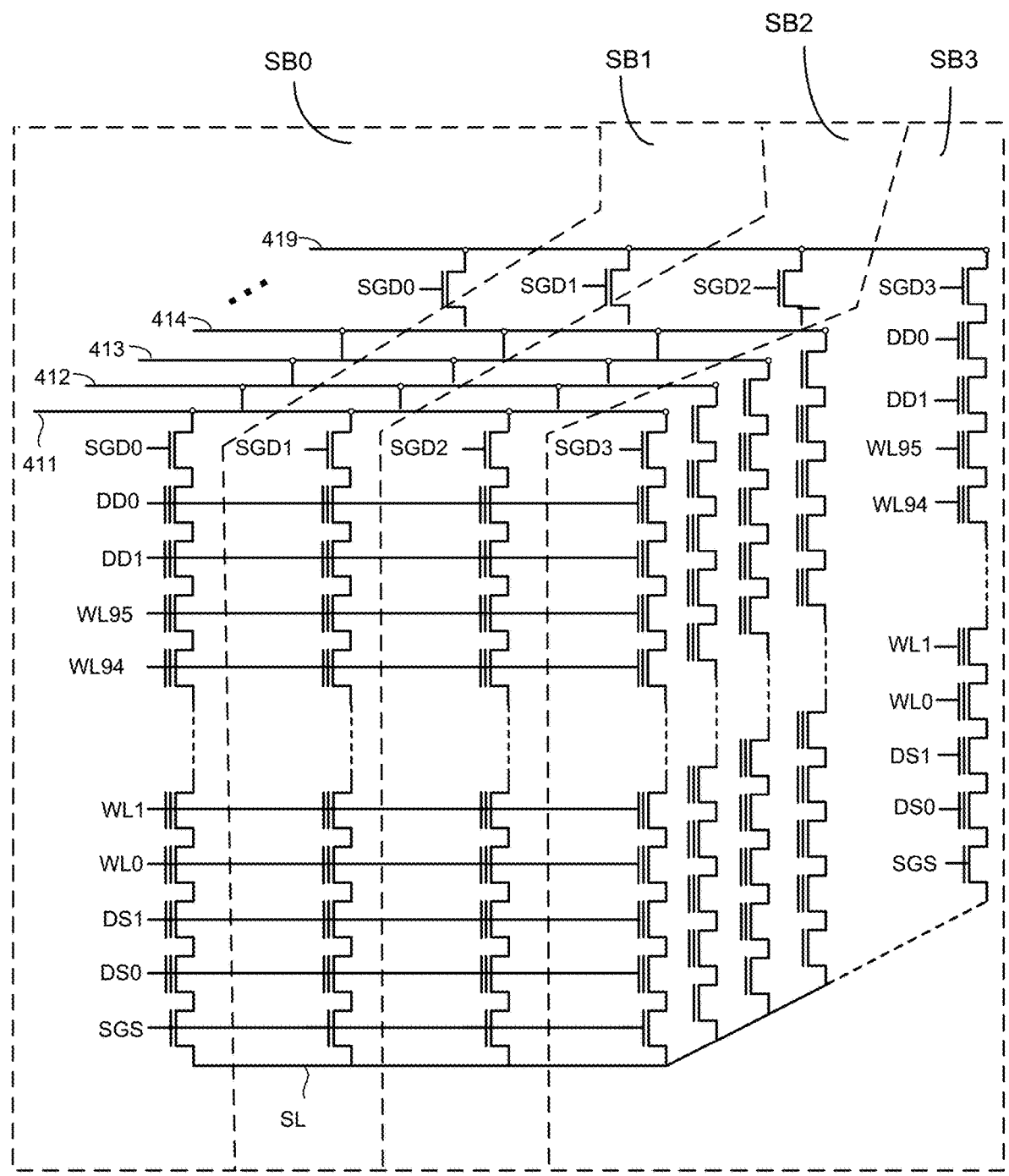
FIG. 4F is a schematic diagram of a portion of one embodiment of a block, depicting several NAND strings.

FIG. 4F is a schematic diagram of a portion of the memory depicted in in FIGS. 4-4E. FIG. 4F shows physical word lines WL0-WL95 running across the entire block. The structure of FIG. 4F corresponds to portion 407 in Block 2 of FIGS. 4A-4E, including bit lines 411, 412, 413, 414, . . . 419. Within the block, each bit line is connected to four NAND strings. Drain side selection lines SGD0, SGD1, SGD2 and SGD3 are used to determine which of the four NAND strings connect to the associated bit line(s). A first sub-block corresponds to those vertical NAND strings controlled by SGD0. A second sub-block corresponds to those vertical NAND strings controlled by SGD1. A third sub-block corresponds to those vertical NAND strings controlled by SGD2. A fourth sub-block corresponds to those vertical NAND strings controlled by SGD4. There may be more or fewer than four sub-blocks in a block.

A source side selection line SGS connects/disconnects the NAND strings to/from the common source line. In some embodiments, there is a source side selection line for each sub-block (similar to the four SGD0, SGD1, SGD2, SGD3). The block can also be thought of as divided into four sub-blocks SB0, SB1, SB2 and SB3. Sub-block SB0 corresponds to those vertical NAND strings controlled by SGD0, Sub-block SB1 corresponds to those vertical NAND strings controlled by SGD1, Sub-block SB2 corresponds to those vertical NAND strings controlled by SGD2, and Sub-block SB3 corresponds to those vertical NAND strings controlled by SGD3.

Although the example memories of FIGS. 4-4F are three dimensional memory structure that includes vertical NAND strings with charge-trapping material, other (2D and 3D) memory structures can also be used with the technology described herein.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv. In some embodiments, verify is not performed during SLC programming.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell).

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 5B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify high voltages are VvA, VvB, VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states. In some embodiments, verify is not performed during MLC programming.

Figure 6:
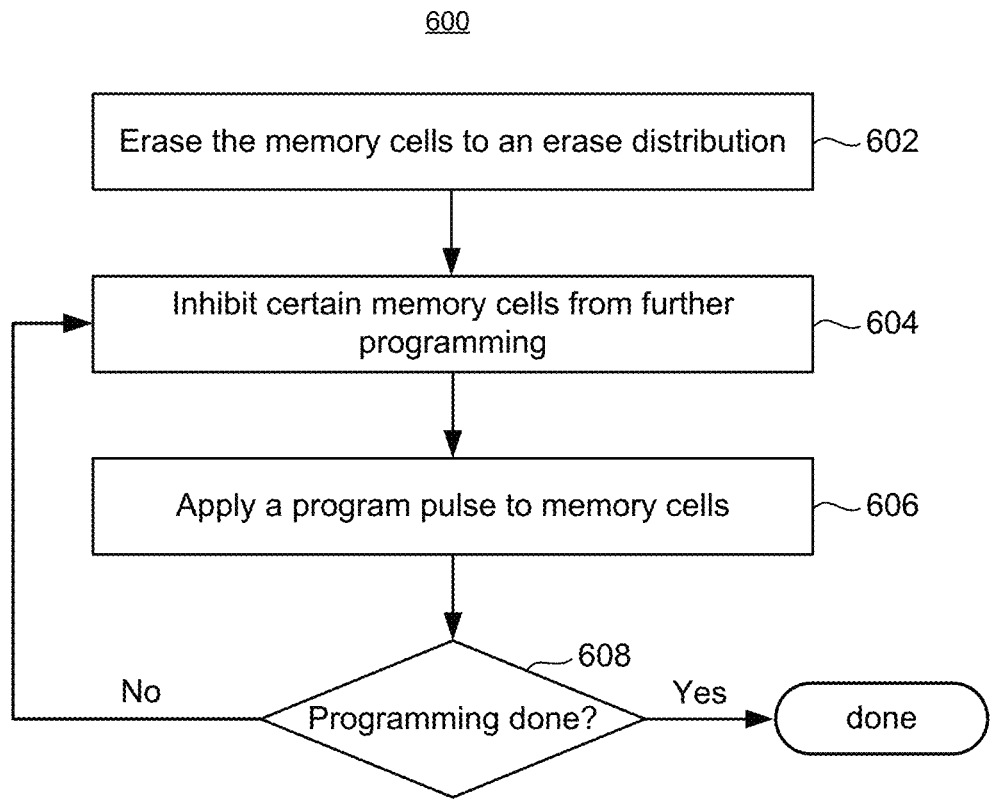
FIG. 6 is a flowchart of one embodiment of a process of erasing and programming memory cells.

In some embodiments, the memory cells are programmed without a verify operation. FIG. 6 is a flowchart of one embodiment of a process 600 of erasing and programming memory cells. In an embodiment, the memory cells reside on NAND strings in a three-dimensional memory structure. Step 602 includes erasing memory cells to an erase distribution. In one embodiment, an entire block is erased. However a unit smaller than a block may be erased.

Steps 604-608 are used to program a group of the memory cells. The process could be used for SLC programming or MLC programming. In an embodiment, the memory cells within one sub-block that are connected to the same word line are programmed together. This word line connected to the memory cells to be programmed is referred to as the selected word line. The memory cells may include a set that is slower programming and set that is faster programming. For example, the memory cells may include a group in region 460b (see FIG. 4C) and a group in region 462b, wherein these two groups program at different speeds.

Step 604 includes inhibition of some of the memory cells from programming. The first time step 604 is performed memory cells that are to remain in the erased state are inhibited from programming so that they will remain in the erased state. In one embodiment, memory cells to be inhibited have a program inhibit voltage (e.g., 2.2V) applied to their respective bit line, whereas memory cells to be programmed have a program enable voltage (e.g., 0V) applied to their respective bit line.

Step 606 includes applying a program pulse to the memory cells in the group. The program pulse may be applied to the selected word line. In one embodiment, the program pulse will raise the Vt of the memory cells to the A-state. Step 608 includes a determination of whether programming is complete. If not, then additional memory cells are inhibited in step 604. In one embodiment, memory cells that are to remain in the A-state are inhibited from further programming at this time. The memory cells were previously inhibited remain inhibited from further programming. Then, another program pulse is applied in step 606. The magnitude of the program pulse may be raised with each iteration of process 600. The process continues in this manner until all memory cells are programmed to their target data states.

Process 600 does not verify the programming. Therefore, each memory cell that is programmed to a given state will receive the same number of program pulses. In some embodiments, a verify is performed to determine whether the Vt of the memory cell has reached its target data state prior to inhibiting the cell out from further programming. In one embodiment, process 600 is modified by performing a verify operation after step 606. In the next iteration of step 604, only memory cells that have been verified to have reached their intended data states are inhibited from further programming. Verifying the memory cells can in some cases produce tighter Vt distributions. However, verifying will take additional time. Therefore, if verify can be avoided then programming is faster.

Figure 7:
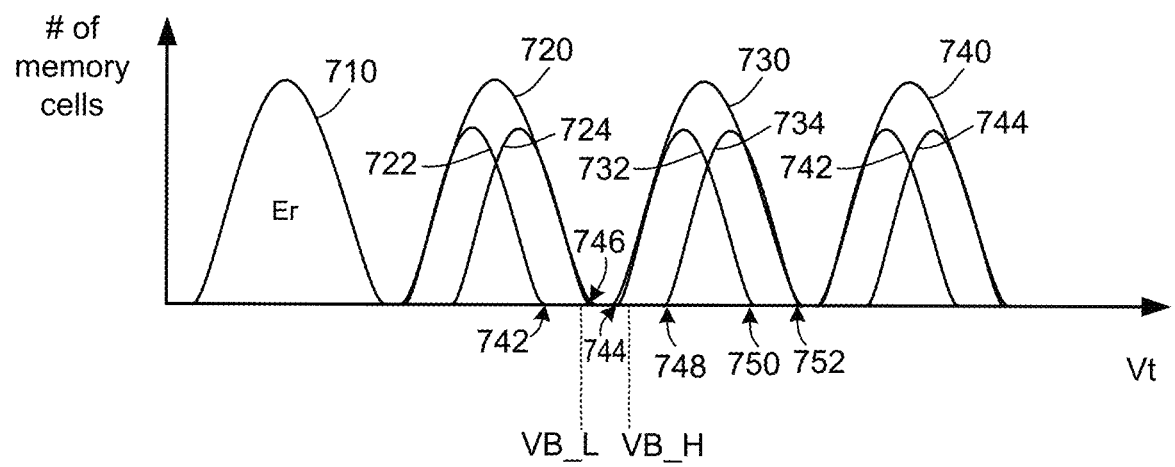
FIG. 7 depicts natural threshold voltage distributions for a group of memory cells.

FIG. 7 depicts natural threshold voltage distributions for a group of memory cells. The natural Vt distribution is the Vt distribution that occurs from, for a given data state, applying the same number of program pulses to each memory cell in the group. The natural Vt distributions occurs as a result of one embodiment of process 600. As one example, memory cells might be programmed from the erased state 710 to the A-state 720 with a single program pulse, to the B-state 730 with two program pulses, and to the C-state 740 with three program pulses. The program pulses may have different magnitudes. For example, a greater magnitude can be used to program cells to a higher Vt. A different number of program pulses can be used than in this example.

Memory cells in one set may on average exhibit a greater increase in Vt for each program pulse than cells in another set. For example, memory cells in region 462b may on average exhibit a greater increase in Vt for each program pulse than cells in region 460b. Memory cells that exhibit a greater increase in Vt for each program pulse are referred to herein as faster programming, whereas memory cells that exhibit a lesser increase in Vt for each program pulse are referred to herein as slower programming. In FIG. 7, natural Vt distributions 710, 720, 730, and 740 are for group as a whole. The slower programming set has natural Vt distributions 722, 732, and 742. The faster programming set has natural Vt distributions 724, 734, and 744.

The natural Vt distributions for the slower programming cells may have a different range in Vt than the faster programming cells. The range of natural Vt distribution 732 for the slower programming set is between a lower tail 744 to an upper tail 750. The range of natural Vt distribution 734 for the faster programming set is between a lower tail 748 to an upper tail 752. The read margin depends on the gap between the upper tail of one Vt distribution and the lower tail of the next Vt distribution. Using a read reference level that is midway between the upper tail of one Vt distribution and the lower tail of the next Vt distribution can reduce read errors. Read level VB_L may be used for the slower programming cells, whereas read level VB_H may be used for the faster programming cells. Read level VB_L is midway between the upper tail 742 of Vt distribution 722 and the lower tail 744 of Vt distribution 732. Read level VB_H is midway between the upper tail 746 of Vt distribution 724 and the lower tail 748 of Vt distribution 734.

Also note that when programming the group of memory cells to the natural Vt distributions 720, 730, 740, the fact that there is a slower programming set of cells and a faster programming set of cells can widen the natural Vt distributions 720, 730, 740, thereby reducing the read margin (for natural Vt distributions 720, 730, 740). However, an embodiment of the memory system will use different sets of read parameters when reading the faster and slower programming cells, which will improve the read margin.

FIG. 8 is a flowchart of one embodiment of a process 800 of programming and reading a group of memory cells. In an embodiment the group is at a word line layer in a sub-block of a three-dimensional structure having vertical NAND strings. The group may contain a first set of memory cells that program at a first speed and a second set of memory cells that program at a second speed. In one embodiment, the first and second sets of memory cells are in the same sub-block. The group may be selected by applying a select voltage to a drain side select line (e.g., SGD) in order to select the sub-block. Also, an appropriate voltage (e.g., program voltage, read reference voltage) is applied to the word line connected to the group of memory cells. The first set of memory cells are in a first region of the sub-block and the second set of memory cells are in a second region of the sub-block. For example, the first set of memory cells are in region 462b of sub-block 420 and the second set of memory cells are in region 460b of the sub-block 420. In one embodiment, the first set of memory cells corresponds to one or more rows of memory holes and the second set of memory cells corresponds to one or more rows of memory holes.

Step 802 includes programming the group without verify. In one embodiment, steps 604-608 of process 600 are used. In an embodiment, the same number of program pulses are applied to each memory cell being programmed to a given data state.

Step 804 includes reading the first set of memory cells with a first set of read parameters. The set of read parameters may include, but is not limited to, a read reference voltage, a sensing time, and a bit line voltage.

Step 806 includes reading the second set of memory cells with a second set of read parameters. The second set of read parameters are different from the first set of read parameters by which it is meant that at least one of the parameters will have a different value. In an embodiment, using the different read parameters compensates for different programming speeds between the first and second sets of memory cells. In an embodiment, using the different read parameters compensates for different physical characteristics of memory cells in the first and second regions of the sub-block. For example, the memory holes could, on average, have different diameters in the different regions. The memory holes in one region could suffer from more irregulates than the memory holes in the other region. As another example, the average thickness of one of more of the memory films that line the memory holes could differ between the two regions.

In one embodiment, the first set of read parameters comprises a first read reference voltage that is applied to a selected word line, and the second set of read parameters comprises a second read reference voltage that is applied to the selected word line. In one embodiment, the second read reference voltage has a different magnitude than the first read reference voltage to compensate for the different programming speeds. FIG. 9 is a flowchart of one embodiment of a process 900 of reading the first set of memory cells using a reference voltage while locking out the second set of memory cells. Process 900 is performed in one embodiment of step 804 in FIG. 8. In one embodiment, process 900 is performed to read memory cells that were programmed in a programming process in which memory cells are verified.

Step 902 includes applying a sensing voltage to first bit lines associated with NAND strings having the first set of memory cells. An example of the sensing voltage is 0.25V+ Vcelsrc, wherein Vcelsrc is the source line voltage. Step 904 includes applying a lockout voltage to second bit lines associated with NAND strings having the second set of memory cells. An example of the lockout voltage is 0V. For example, with reference to FIG. 4B, the first bit lines are those that connect to one of the memory holes in region 462a and the second bit lines are those that connect to one of the memory holes in region 460a. The sensing voltage allows the memory cells to be sensed. The lockout voltage saves current by preventing memory cells on NAND strings having the second set of memory cells from conducting a current.

Step 906 includes applying a first read reference voltage to the selected word line. Step 908 includes sensing the first set of memory cells. Step 908 is performed while the voltages referred to in steps 902, 904, and 906 are applied.

After performing process 900 to sense the first set of memory cells, the process 900 is performed again but modified to sense the second set of memory cells. Thus, the sensing voltage is applied to the second bit lines while the lockout voltage is applied to the first bit lines. However, rather than using the first read reference voltage, a second read reference voltage is applied to the selected word line. The magnitude of the second read reference voltage is different from the first in order to compensate for the different programming speeds. As one example, the first read reference voltage is VB_H and the second read reference voltage is VB_L (see FIG. 7). The first read reference voltage is VB_H may be used when reading faster programming cells, and the second read reference voltage is VB_L may be used when reading slower programming cells.

Figure 10:
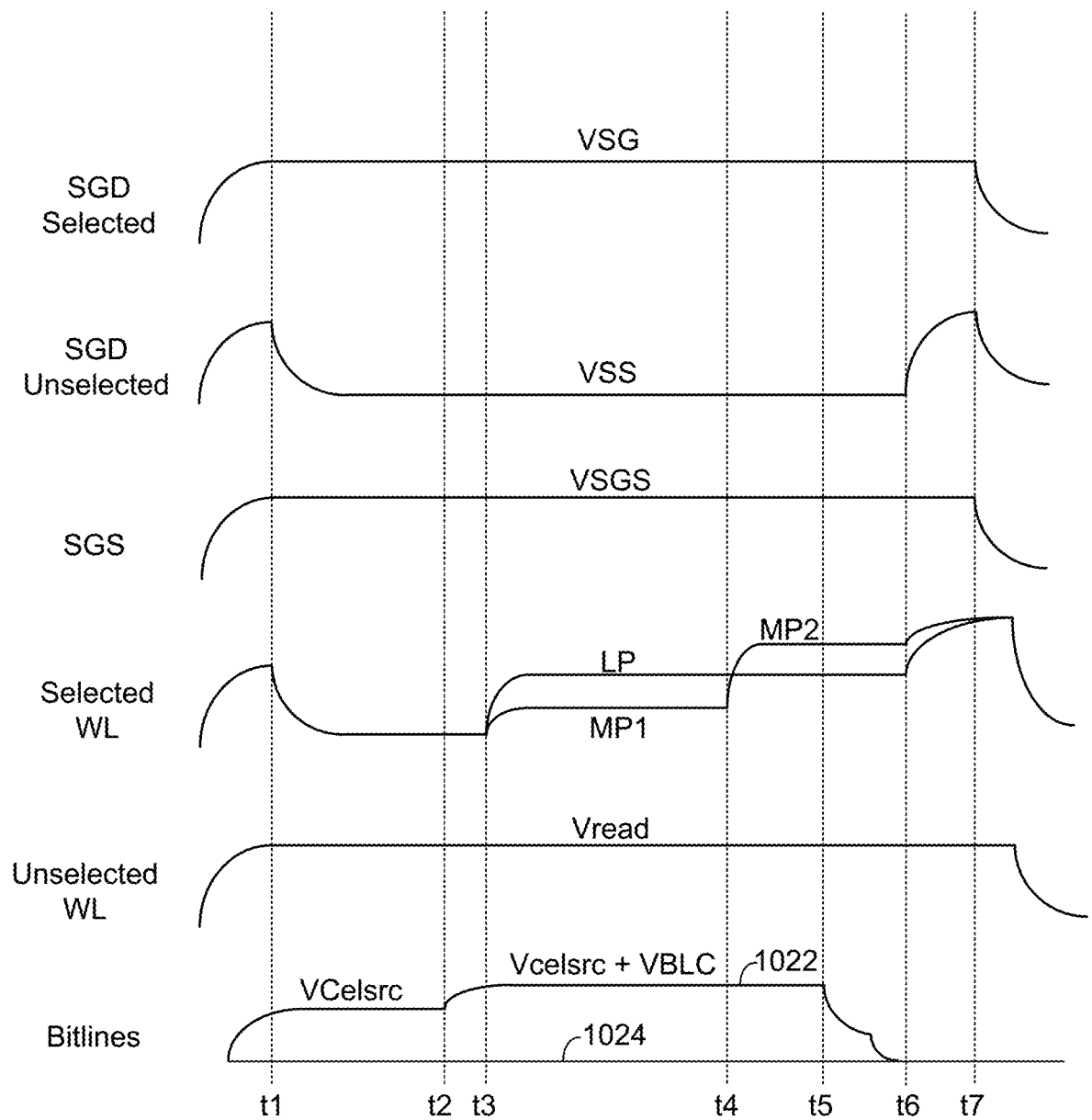
FIG. 10 depicts details of timing of voltage waveforms for an embodiment of process.

FIG. 10 depicts details of timing of voltage waveforms for an embodiment of process 900. The select the sub-block the drain side select line (SGD) is held at a select voltage (VSG) from t1 until t7. Other sub-blocks within the sub-block are unselected. In one embodiment, the drain side select lines of the unselected sub-blocks are briefly spiked at t1. Also, at the end of the read operation, the drain side select lines of the unselected sub-blocks are briefly spiked between t6 and t7. Between t1 and t6 the unselected SDGs are held at VSS (e.g., 0V). The source side select line for the block is held at a select voltage (VSGS) between t1 and t7. Note that, in one embodiment, there is a single source side select line for the entire block. Optionally, there could be a separate source side select line for each sub-block.

FIG. 10 shows example bit line voltages for the first set of cells (to be read) and the second set of cells (locked out). Plot 1022 is for the first set of cells (to be read). At t1, the bit lines are raised to VCelsrc (which is the voltage applied to the source line). Between t2 to t3, the bit line voltage is raised to the sensing voltage. In one embodiment the sensing voltage is about 0.25V greater than VCelsrc. The bit line voltage is held at the sensing voltage between t3 to t5. Thus, sensing of the first set of the memory cells occurs between t3 to t5. Plot 1024 is for the second set of cells (to be locked out). The bit line voltage is held at 0V for the cells to be locked out.

FIG. 10 shows the voltages applied to the selected word line (WL) for two different read cases, which have a total of three read reference levels. One case is for a lower page (LP) read. The other case is for a middle page (MP) read. With reference to FIG. 7, an embodiment of a lower page read will sense at VB_H for the first set of cells and VB_L for the second set of cells. FIG. 7 does not expressly depict the read reference levels for the middle page read. The middle page read will have a first sense operation to determine whether the memory cell has a Vt above/below a level that separates the Erased state 710 from the A-state 710 and a second sense operation to determine whether the memory cell has a Vt above/below a level that separates the B-state 730 from the C-state 740. When reading the lower page the selected word line is raised to LP (e.g., VB H) at t3 and held there until t6. The first set of memory cells are sensed while the selected word line is at LP. When reading the middle page the selected word line is raised to MP1 at t3 and held there until t4. A first middle page sensing operation is performed between t3 and t4. The selected word line is then raised to MP2 at t4 and held there until t6. A second middle page sensing operation is performed between t4 and t5. The unselected word lines are held at a read pass voltage (Vread) between t1 and t7. The read pass voltage is a relatively high magnitude voltage that will turn on all unselected memory cells on the NAND strings having a memory cell being sensed (thus acting as pass gates). When sensing the second set of memory cells the voltage waveforms will be the same as in FIG. 10, but the sensing voltage (plot 1022) is now applied to the bit lines associated with the second set of memory cells and the lockout voltage (plot 1024) is now applied to the bit lines associated with the first set of memory cells. Also, the magnitude of the voltages on the selected word line will be tailored to the second set of memory cells. For example, if VB_H was used for the lower page for the first set of memory cells, VB_L may be used for the lower page for the second set of memory cells.

Figure 11:
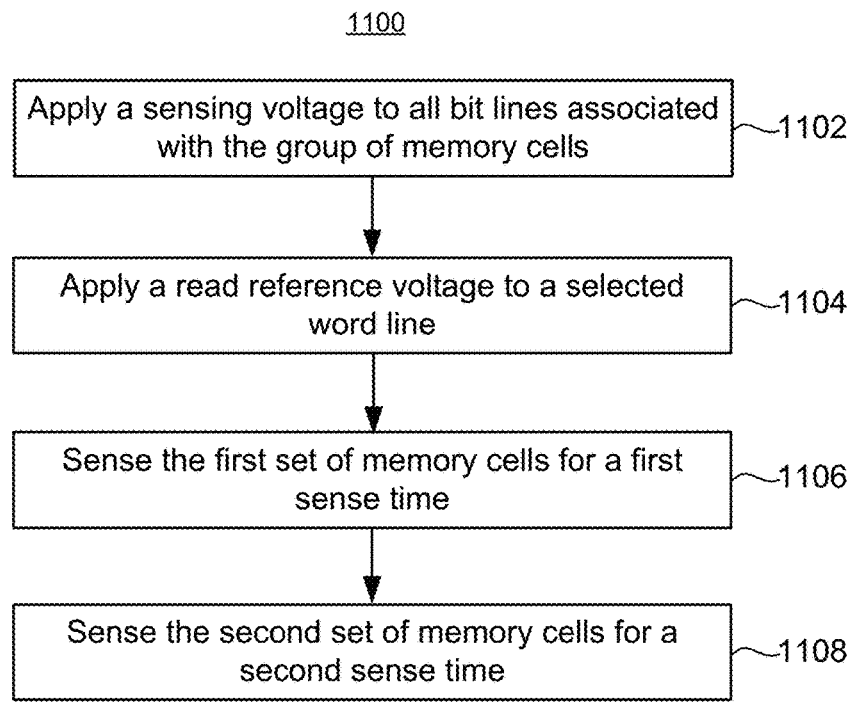
FIG. 11 is a flowchart of one embodiment of a process of reading the first and second sets of memory cells using different sense times.

In one embodiment, the first set of read parameters comprises a first sense time for sensing a conduction current of respective memory cells in the first set and the second set of read parameters comprises a second sense time for sensing a conduction current of respective memory cells in the second set. In one embodiment, the second sense time has a different duration than the first sense time to compensate for the different programming speeds. FIG. 11 is a flowchart of one embodiment of a process 1100 of reading the first and second sets of memory cells using different sense times. Process 1100 is performed in one embodiment of steps 804 and 806 in FIG. 8.

Step 1102 includes applying a sensing voltage to all of the bit lines associated with NAND strings in the group. An example of the sensing voltage is 0.25V+Vcelsrc, wherein Vcelsrc is the source line voltage.

Step 1104 includes applying a read reference voltage to the selected word line. In an embodiment, the read reference voltage is a default read reference voltage that does not provide compensation for the different programming speeds. Examples of default read reference voltages are depicted in FIGS. 5A (Vr) and 5B (VrA, VrB, etc.). With reference to FIG. 7, the default read reference voltage for the lower page is about midway between VB_L and VB H. The default read reference voltage for the lower page may be based on the location of the upper tail of Vt distribution 720 and the lower tail of Vt distribution 730.

Step 1106 includes sensing the first set of memory cells for a first sense time. Step 1106 includes sensing the second set of memory cells for a second sense time. Steps 1106 and 1108 may be performed together while the sensing voltage is applied to the bit lines and the read reference voltage is applied to the selected word line. In an embodiment, each bit line is associated with a sense amplifier. Each sense amplifier has a sense node that is pre-charged and then discharged for the sensing time. The sense node may be discharged by connecting the sense node to the relevant bit line for the sense time. The current of the bit line will depend on the memory cell's conduction current, which is a function of the Vt of the memory cell. The sense node may include a capacitor.

Figure 12:
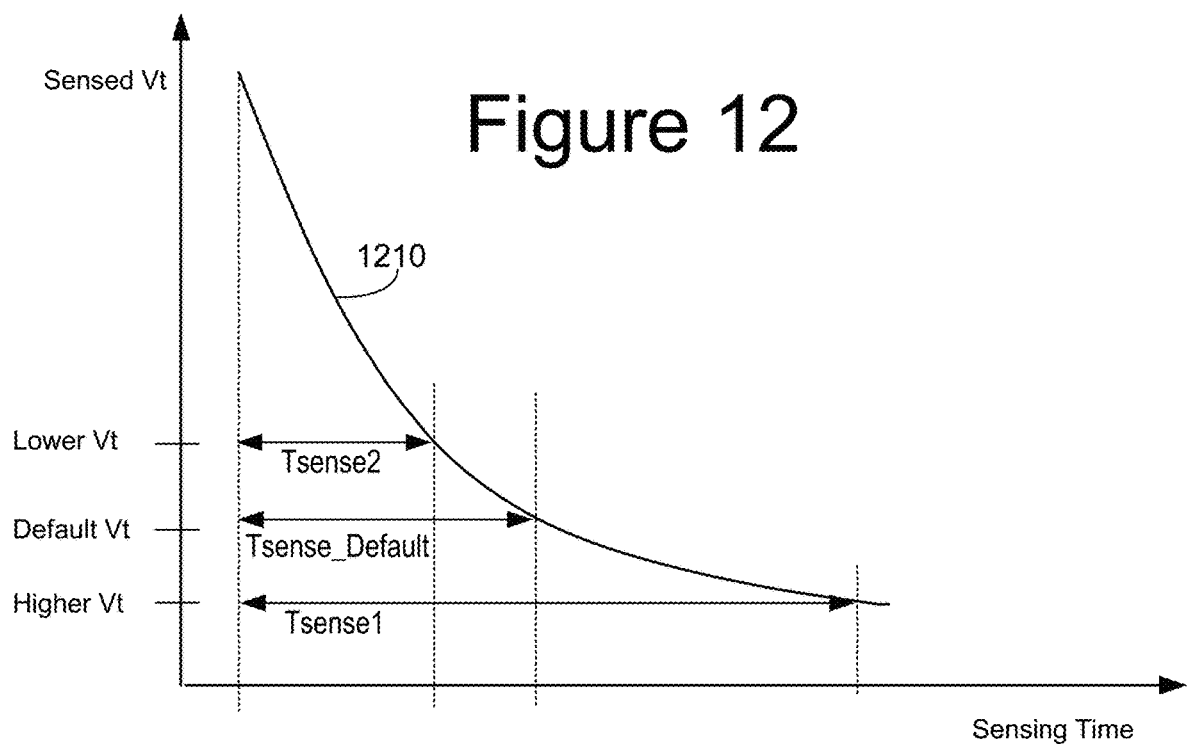
FIG. 12 is a graph that depicts further details of using different sense times to discharge a sense node.

FIG. 12 is a graph that depicts further details of using different sense times to discharge a sense node. Plot 1210 shows the effective Sense Vt versus sensing time. The default sense time (Tsense_Default) is the amount of time for which the sense node is discharged assuming no compensation is provided for the programming speed of the memory cells. The default sensing time will test for a default Vt. Using a longer sense time allows the memory cell current to discharge the sense node for a longer time, which means that a lower memory cell current can cause the sense amplifier to trip. Using a longer sense time (e.g., Tsense1) has the effect of testing for a higher Vt. Using a shorter sense time allows less time for the memory cell current to discharge the sense node, which means that a higher memory cell current is needed to cause he sense amplifier to trip. Using a shorter sense time (e.g., Tsense2) has the effect of testing for a lower Vt.

In one embodiment, the shorter sense time (e.g., Tsense2) is used for the slower programming memory cells and the longer sense time (e.g., Tsense1) is used for the faster programming memory cells. In one embodiment, the default sense time is used for no compensation for programming speed. For example, one of the sub-blocks can be read without compensation for programming speed. As another alternative, the sub-block may be divided into three regions: region 1) slower programming (Tense2); region 2) normal programming (Tense_Default); and region 3) faster programming (Tense1).

In an embodiment of the process 1100 in FIG. 11, steps 1106 and 1108 are performed together. However, in one embodiment, steps 1106 and 1108 are performed separately by locking out one of the sets of memory cells similar process 900. In such an embodiment, rather than applying the sensing voltage to all bit lines in step 1102, the sensing voltage is applied to one set of the bit lines (similar to step 902 in process 900) while the lockout voltage is applied to the other set of bit lines (similar to step 904 in process 900). Thus, this modified process can be performed once to sense the first set of cells and a second time to sense the second set of cells.

In one embodiment, the first set of read parameters comprises a first bit line voltage for first bit lines connected to NAND strings associated with the first set of memory cells and the second set of read parameters comprises a second bit line voltage first second bit lines connected to NAND strings associated with the second set of memory cells. In one embodiment, the second bit line voltage has a different magnitude than the first bit line voltage to compensate for the different programming speeds. In one embodiment, the first bit line voltage creates drain-induced barrier lowering (DIBL) in the first set of memory cells.

Figure 13:
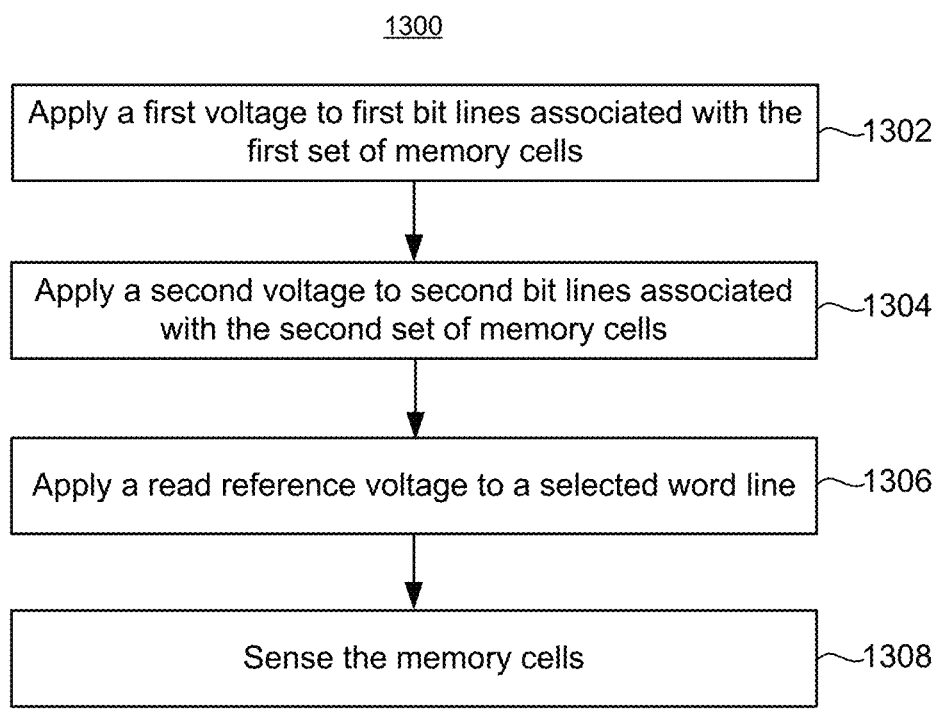
FIG. 13 is a flowchart of one embodiment of a process of reading the group of memory cells using a different bit line voltage for the first set and second set of memory cells.

FIG. 13 is a flowchart of one embodiment of a process 1300 of reading the group of memory cells using a different bit line voltage for the first set and second set of memory cells. Process 1300 is performed in one embodiment of steps 804 and 806 in FIG. 8. Step 1302 includes applying a first voltage to first bit lines associated with NAND strings having the first set of memory cells. The first voltage will create a DIBL effect in the respective memory cells in the second set (in this case the faster programming cells).

Step 1304 includes applying a second voltage to second bit lines associated with NAND strings having the second set of memory cells. This second voltage may be a default sensing voltage, as was used in step 902 of process 900. An example of the default sensing voltage is 0.25V+Vcelsrc, wherein Vcelsrc is the source line voltage. In an embodiment, the first bit line voltage is about 0.6V greater than the second bit line voltage to create a sufficient DIBL effect. However, the first bit line voltage could be more than 0.6V higher than the second bit line voltage or less than 0.6V higher than the second bit line voltage.

Step 1306 includes applying a read reference voltage to the selected word line. In an embodiment, the read reference voltage is the lower read reference voltage that is used in step 906 when the slower programming memory cells are being sensed. For example, VB_L may be applied to the selected word line in step 1306. The net result is that the second set of memory cells are sensed in a similar manner as process 900 (when used to sense slower programming cells).

Step 1308 includes sensing all of the memory cells in the group. Step 1308 is performed while the voltages referred to in steps 1302, 1304, and 1306 are applied. As noted, the first voltage applied to the first bit lines may create a DIBL effect in memory cells in the first set. This may have the effect of sensing for a higher Vt, relative to the magnitude of the read reference voltage applied to the selected word line. The net effect is to, for example, sense at VB_L for the second set of memory cells (e.g., slower programming) while having the effect of sensing at VB_H for the first set of memory cells (e.g., faster programming).

Figure 14:
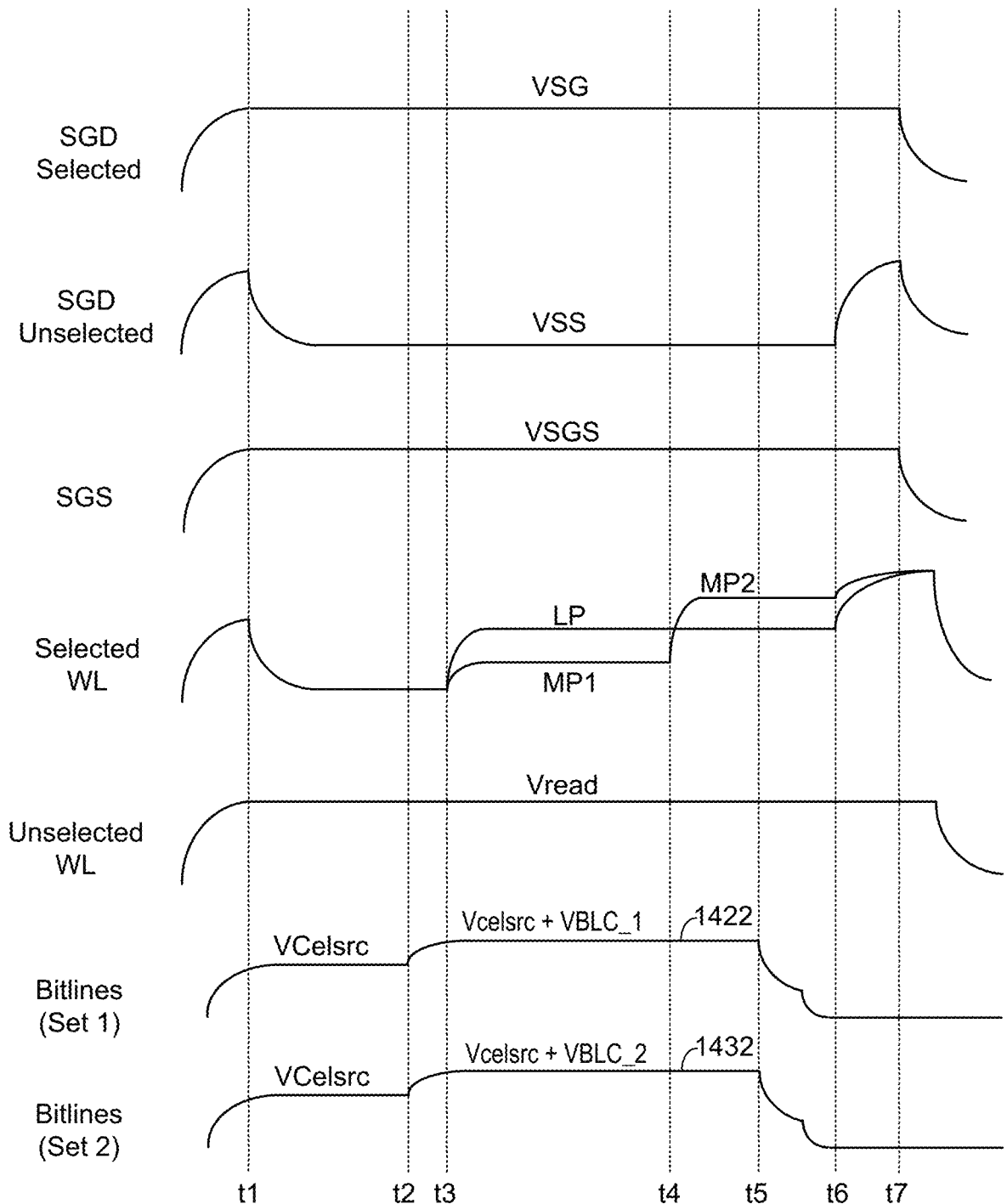
FIG. 14 depicts details of timing of voltage waveforms for an embodiment of the process of FIG. 13.

FIG. 14 depicts details of timing of voltage waveforms for an embodiment of process 1300. The voltage waveforms for SDG selected, SGD unselected, SGS, the selected WL, and the unselected WLs are similar to the waveforms in FIG. 10. Plot 1422 shows the voltage applied to the bit lines for the first set of memory cells (faster programming). Plot 1432 shows the voltage applied to the bit lines for the second set of memory cells (slower programming). The timing for plots 1422 and 1432 are similar to the timing for plot 1022 in FIG. 10. Between t3 and t5, plot 1422 shows that the first set of bit lines are at the first sensing voltage (Vcelsrc+VBLC_1). In an embodiment, VBLC_1 is about 0.85V to create a DIBL effect in the first set of memory cells. However, VBLC_1 could be greater than or less than 0.85V to create a sufficient DIBL effect in the first set of memory cells. Between t3 and t5, plot 1432 shows that the second set of bit lines are at the second sensing voltage (Vcelsrc+VBLC_2). In an embodiment, VBLC_1 is about 0.25V, which may be a default sensing voltage that does not create significant DIBL effect in the second set of memory cells.

In view of the foregoing, a first embodiment includes an apparatus, comprising one or more control circuits configured to connect to a three-dimensional memory structure comprising a plurality of NAND strings having memory cells. The three-dimensional memory structure comprises a plurality of word lines. The three-dimensional memory structure comprises a plurality of bit lines. Each NAND string is associated with a bit line. The one or more control circuits are configured to program a group of the memory cells together that are connected to a selected word line to one or more data states. The programming includes applying for each data state a same number of program pulses to each memory cell being programmed to the data state. The group comprises a first set of memory cells that program at a first speed and a second set of memory cells that program at a second speed that is different from the first program speed. The one or more control circuits are configured to read the first set of the memory cells with a first set of read parameters. The one or more control circuits are configured to read the second set of the memory cells with a second set of read parameters. The first set of read parameters are different from the second set of read parameters to compensate for the different programming speeds.

In a second embodiment, in furtherance to the first embodiment, the first set of read parameters comprises a first read reference voltage that is applied to the selected word line. The second set of read parameters comprises a second read reference voltage that is applied to the selected word line. The second read reference voltage has a different magnitude than the first read reference voltage to compensate for the different programming speeds.

In a third embodiment, in furtherance to the first or second embodiments, the one or more control circuits are configured to apply the first read reference voltage to the selected word line while applying a sense voltage to first bit lines associated with first NAND strings having the first set of memory cells and while applying a lockout voltage to second bit lines associated with second NAND strings having the second set of memory cells. The one or more control circuits are configured to sense the first set of memory cells in response to the first read reference voltage. The one or more control circuits are configured to apply the second read reference voltage to the selected word line while applying the sense voltage to the second bit lines and while applying the lockout voltage to the first bit lines. The one or more control circuits are configured to sense the second set of memory cells in response to the second read reference voltage.

In a fourth embodiment, in furtherance to the first embodiment, the first set of read parameters comprises a first sense time for sensing a conduction current of respective memory cells in the first set. The second set of read parameters comprises a second sense time for sensing a conduction current of respective memory cells in the second set. The second sense time has a different duration than the first sense time to compensate for the different programming speeds.

In a fifth embodiment, in furtherance the fourth embodiment, the one or more control circuits are configured to apply a read reference voltage to the selected word line. The one or more control circuits are configured to sense the first set of memory cells for the first sense time while applying the read reference voltage to the selected word line. The one or more control circuits are configured to sense the second set of memory cells for the second sense time while applying the read reference voltage to the selected word line.

In a sixth embodiment, in furtherance to the first embodiment the first set of read parameters comprises a first bit line voltage for first bit lines associated with first NAND strings having the first set of memory cells. The second set of read parameters comprises a second bit line voltage for second bit lines associated with second NAND strings having the second set of memory cells. The second bit line voltage has a different magnitude than the first bit line voltage to compensate for the different programming speeds.

In a seventh embodiment, in furtherance to the sixth embodiment, the one or more control circuits are configured to apply a read reference voltage to the selected word line. The one or more control circuits are configured to sense the first set of memory cells while applying the first bit line voltage to the first bit lines and while applying the read reference voltage to the selected word line. The one or more control circuits are configured to sense the second set of memory cells while applying the second bit line voltage to the second bit lines and while applying the read reference voltage to the selected word line.

In an eighth embodiment, in furtherance to any of the first to seventh embodiments, the three-dimensional memory structure comprises a plurality of blocks, each block comprising a plurality of sub-blocks. Each sub-block comprises a group of the NAND strings. Each block comprises a select line connected to the group of the NAND strings in the sub-block. The three-dimensional memory structure resides on a first semiconductor die. The group of the memory cells resides on the group of the NAND strings within a selected sub-block. The one or more control circuits are configured to select the sub-block for programming and read by applying a select voltage to the select line associated with the selected sub-block. The one or more control circuits resides on a second semiconductor die.

In a ninth embodiment, in furtherance to the any of the first to eighth embodiments, the one or more control circuits are configured to program the group of the memory cells to one bit per memory cell together without verifying. The first set of the memory cells is programmed to a first natural threshold voltage distribution. The second set of the memory cells is programmed to a second natural threshold voltage distribution that has a different threshold voltage range than the first natural threshold voltage distribution. The one or more control circuits are configured to read the one bit per memory cell in the first set of the memory cells with the first set of read parameters. The one or more control circuits are configured to read the one bit per memory cell in the second set of the memory cells with a second set of read parameters. The first set of read parameters are different from the second set of read parameters to compensate for different threshold voltage ranges in the first and the second natural threshold voltage distributions.

In a tenth embodiment, in furtherance to any of the first to the eighth embodiments, the one or more control circuits are configured to program the group of the memory cells to multiple bits per memory cell together without verifying. The first set of the memory cells is programmed to a first set of natural threshold voltage distributions. The second set of the memory cells is programmed to a second set of natural threshold voltage distributions that have different threshold voltage ranges than corresponding distributions in the first set of natural threshold voltage distributions. The one or more control circuits are configured to read the multiple bits per memory cell in the first set of the memory cells with the first set of read parameters. The one or more control circuits are configured to read the multiple bits per memory cell in the second set of the memory cells with the second set of read parameters. The first set of read parameters are different from the second set of read parameters to compensate for different threshold voltage ranges in the first set and the second set of natural threshold voltage distributions.

One embodiment includes a method for programming and reading memory cells. The method comprises programming a first set of memory cells in a three-dimensional memory structure to a first natural threshold voltage distribution while programming a second set of memory cells in the three-dimensional memory structure to a second natural threshold voltage distribution. The second natural threshold voltage distribution has a different threshold voltage range than the first natural threshold voltage distribution. The method comprises reading the first set of the memory cells with a first set of read parameters. The method comprises reading the second set of the memory cells with a second set of read parameters. The first set of read parameters are different from the second set of read parameters to compensate for the different threshold voltage ranges in the first and the second natural threshold voltage distributions.

One embodiment includes a non-volatile storage system comprising a three-dimensional memory structure comprising a plurality of blocks. Each block comprises a plurality of NAND strings and a plurality of word lines associated with the NAND strings. The three-dimensional memory structure has a plurality of bit lines. Each NAND string is associated a bit line. Each block comprises a plurality of sub-blocks. Each sub-block comprises a group of the NAND strings in the block. Each block comprises a select line connected to the group of the NAND strings in the sub-block. The non-volatile storage system comprises one or more control circuits connected to the three-dimensional memory structure. The one or more control circuits are configured to apply a select voltage to the select line of a selected sub-block connected to a selected group of the NAND strings. The one or more control circuits are configured to program a selected group of memory cells in the selected sub-block. The selected group of memory cells are connected to a selected word line. The selected group comprises a first set of memory cells in a first region of the selected sub-block and a second set of memory cells in a second region of the selected sub-block. The first set of memory cells have a first natural threshold voltage distribution that has a different threshold voltage range than a second natural threshold voltage distribution of the second set of memory cells. The one or more control circuits are configured to read the first set of the memory cells with a first set of read parameters while locking out the second set of the memory cells. The one or more control circuits are configured to read the second set of the memory cells with a second set of read parameters while locking out the first set of the memory cells. The first set of read parameters are different from the second set of read parameters to compensate for the different physical characteristic in the memory cells in first and the second regions of the sub-block.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
one or more control circuits configured to connect to a three-dimensional memory structure comprising a plurality of NAND strings having memory cells, the three-dimensional memory structure comprising blocks separated by isolation regions with each block having a plurality of word lines extending in a first direction, the three-dimensional memory structure comprising a plurality of bit lines extending in a second direction perpendicular to the first direction, each NAND string associated with a bit line, wherein the one or more control circuits are configured to:
program a group of the memory cells together that are connected to a selected word line in a selected block to one or more data states, the group of memory cells having a plurality of rows of memory cells that extend in the first direction, including applying for each data state a same number of program pulses to each memory cell being programmed to the data state, wherein the group comprises a first set of memory cells in a first one or more rows of the rows that program at a first speed and a second set of memory cells in a second one or more rows of the rows that program at a second speed that is different from the first programming speed, wherein the memory cells in the first set of memory cells are a different distance than the memory cells in the second set of memory cells to the isolation region that separates the selected block from an adjacent block;

read the first set of the memory cells with a first set of read parameters; and
read the second set of the memory cells with a second set of read parameters, wherein the first set of read parameters are different from the second set of read parameters to compensate for the different programming speeds.

2. The apparatus of claim 1, wherein:
the first set of read parameters comprises a first read reference voltage that is applied to the selected word line; and
the second set of read parameters comprises a second read reference voltage that is applied to the selected word line, the second read reference voltage has a different magnitude than the first read reference voltage to compensate for the different programming speeds.

3. The apparatus of claim 2, wherein the one or more control circuits are configured to:
apply the first read reference voltage to the selected word line while applying a sense voltage to first bit lines associated with first NAND strings having the first set of memory cells and while applying a lockout voltage to second bit lines associated with second NAND strings having the second set of memory cells;
sense the first set of memory cells in response to the first read reference voltage;
apply the second read reference voltage to the selected word line while applying the sense voltage to the second bit lines and while applying the lockout voltage to the first bit lines; and
sense the second set of memory cells in response to the second read reference voltage.

4. The apparatus of claim 1, wherein:
the first set of read parameters comprises a first sense time for sensing a conduction current of respective memory cells in the first set; and
the second set of read parameters comprises a second sense time for sensing a conduction current of respective memory cells in the second set, wherein the second sense time has a different duration than the first sense time to compensate for the different programming speeds.

5. The apparatus of claim 4, wherein the one or more control circuits are configured to:
apply a read reference voltage to the selected word line;
sense the first set of memory cells for the first sense time while applying the read reference voltage to the selected word line; and
sense the second set of memory cells for the second sense time while applying the read reference voltage to the selected word line.

6. The apparatus of claim 1, wherein:
the first set of read parameters comprises a first bit line voltage for first bit lines associated with first NAND strings having the first set of memory cells; and
the second set of read parameters comprises a second bit line voltage for second bit lines associated with second NAND strings having the second set of memory cells, wherein the second bit line voltage has a different magnitude than the first bit line voltage to compensate for the different programming speeds.

7. The apparatus of claim 6, wherein the one or more control circuits are configured to:
apply a read reference voltage to the selected word line;
sense the first set of memory cells while applying the first bit line voltage to the first bit lines and while applying the read reference voltage to the selected word line; and
sense the second set of memory cells while applying the second bit line voltage to the second bit lines and while applying the read reference voltage to the selected word line.

8. The apparatus of claim 1, wherein:
each block comprises a plurality of sub-blocks, each sub-block comprising a group of the NAND strings, wherein each block comprises a select line connected to the group of the NAND strings in the sub-block, wherein the three-dimensional memory structure resides on a first semiconductor die;
the group of the memory cells resides on the group of the NAND strings within a selected sub-block; and
the one or more control circuits are configured to select the sub-block for programming and read by applying a select voltage to the select line associated with the selected sub-block, wherein the one or more control circuits resides on a second semiconductor die.

9. The apparatus of claim 1, wherein the one or more control circuits are configured to:
program the group of the memory cells to one bit per memory cell together without verifying, wherein the first set of the memory cells is programmed to a first natural threshold voltage distribution, wherein the second set of the memory cells is programmed to a second natural threshold voltage distribution that has a different threshold voltage range than the first natural threshold voltage distribution;
read the one bit per memory cell in the first set of the memory cells with the first set of read parameters; and
read the one bit per memory cell in the second set of the memory cells with a second set of read parameters, wherein the first set of read parameters are different from the second set of read parameters to compensate for different threshold voltage ranges in the first and the second natural threshold voltage distributions.

10. The apparatus of claim 1, wherein the one or more control circuits are configured to:
program the group of the memory cells to multiple bits per memory cell together without verifying, wherein the first set of the memory cells is programmed to a first set of natural threshold voltage distributions, wherein the second set of the memory cells is programmed to a second set of natural threshold voltage distributions that have different threshold voltage ranges than corresponding distributions in the first set of natural threshold voltage distributions;
read the multiple bits per memory cell in the first set of the memory cells with the first set of read parameters; and
read the multiple bits per memory cell in the second set of the memory cells with the second set of read parameters, wherein the first set of read parameters are different from the second set of read parameters to compensate for different threshold voltage ranges in the first set and the second set of natural threshold voltage distributions.

11. A method for programming and reading memory cells, the method comprising:
programming a first set of memory cells in a selected block in a three-dimensional memory structure to a first natural threshold voltage distribution while programming a second set of memory cells in the selected block in the three-dimensional memory structure to a second natural threshold voltage distribution, the first set of memory cells comprising one or more rows of memory cells that extend perpendicular to bit lines, the second set of memory cells comprising one or more rows of memory cells that extend perpendicular to the bit lines, wherein the second natural threshold voltage distribution has a different threshold voltage range than the first natural threshold voltage distribution, wherein the first set of memory cells are a different distance than the second set of memory cells to an isolation region that separates the selected block from an adjacent block;

reading the first set of the memory cells with a first set of read parameters; and reading the second set of the memory cells with a second set of read parameters, wherein the first set of read parameters are different from the second set of read parameters to compensate for the different threshold voltage ranges in the first and the second natural threshold voltage distributions.

12. The method of claim 11, wherein reading the first set of the memory cells with the first set of read parameters and reading the second set of the memory cells with the second set of read parameters comprises:

applying a first read reference voltage to a selected word line while applying a sense voltage to a first set of the bit lines associated with first NAND strings having the first set of memory cells and while applying a lockout voltage to a second set of the bit lines associated with second NAND strings having the second set of memory cells, wherein the selected word line is connected to the first set of memory cells and the second set of memory cells;

sensing the first set of memory cells in response to the first read reference voltage;

applying a second read reference voltage to the selected word line while applying the sense voltage to the second set of the bit lines and while applying the lockout voltage to the first set of the bit lines, wherein the second read reference voltage has a different magnitude than the first read reference voltage to compensate for the different threshold voltage ranges; and sensing the second set of memory cells in response to the second read reference voltage.

13. The method of claim 11, wherein reading the first set of the memory cells with the first set of read parameters and reading the second set of the memory cells with the second set of read parameters comprises:

applying a read reference voltage to a selected word line connected to the first set of memory cells and the second set of memory cells;

sensing the first set of memory cells for a first sense time while applying the read reference voltage to the selected word line; and sensing the second set of memory cells for a second sense time while applying the read reference voltage to the selected word line, wherein the second sense time has a different duration than the first sense time to compensate for the different threshold voltage ranges.

14. The method of claim 11, wherein reading the first set of the memory cells with the first set of read parameters and reading the second set of the memory cells with the second set of read parameters comprises:

applying a read reference voltage to a selected word line connected to the first set of memory cells and the second set of memory cells;

sensing the first set of memory cells while applying a first bit line voltage to a first set of the bit lines associated with first NAND strings having the first set of memory cells and while applying the read reference voltage to the selected word line; and sensing the second set of memory cells while applying a second bit line voltage to a second set of the bit lines associated with second NAND strings having the second set of memory cells and while applying the read reference voltage to the selected word line, wherein the second bit line voltage has a different magnitude than the first bit line voltage to compensate for the different threshold voltage ranges.

15. A non-volatile storage system comprising:

a three-dimensional memory structure comprising a plurality of blocks, the blocks separated from each other by isolation regions, each block comprising a plurality of NAND strings and a plurality of word lines associated with the NAND strings, the three-dimensional memory structure having a plurality of bit lines, each NAND string associated a bit line, each block comprising a plurality of sub-blocks, each sub-block comprising a group of the NAND strings in the block, each block comprising a select line connected to the group of the NAND strings in the sub-block; and one or more control circuits connected to the three-dimensional memory structure, wherein the one or more control circuits are configured to:

apply a select voltage to the select line of a selected sub-block connected to a selected group of the NAND strings in a selected block;

program a selected group of memory cells in the selected sub-block, wherein the selected group of memory cells are connected to a selected word line in the selected block, wherein the selected group comprises a first set of memory cells in a first region of the selected sub-block and a second set of memory cells in a second region of the selected sub-block, wherein the first set of memory cells are a different distance than the second set of memory cells to a first isolation region that separates the selected block from an adjacent block, wherein the first set of memory cells and the second set of memory cells have a different physical characteristic that leads to a different programming characteristic;

read the first set of the memory cells with a first set of read parameters while locking out the second set of the memory cells; and read the second set of the memory cells with a second set of read parameters while locking out the first set of the memory cells, wherein the first set of read parameters are different from the second set of read parameters to compensate for the different programming characteristic in the memory cells in first and the second regions of the sub-block.

16. The non-volatile storage system of claim 15, wherein the one or more control circuits are configured to:

apply a first read reference voltage to the selected word line while applying a sense voltage to first bit lines associated with the first set of memory cells and while applying a lockout voltage to second bit lines associated with the second set of memory cells;

sense the first set of memory cells in response to the first read reference voltage;

apply a second read reference voltage to the selected word line while applying the sense voltage to the second bit lines and while applying the lockout voltage to the first bit lines; and sense the second set of memory cells in response to the second read reference voltage.

17. The non-volatile storage system of claim 15, wherein the one or more control circuits are configured to:

sense the first set of memory cells for a first sense time while applying a read reference voltage to the selected word line, wherein the first sense time is greater than a default sense time; and sense the second set of memory cells for a second sense time while applying the read reference voltage to the selected word line, wherein the second sense time is less than the default sense time.

18. The non-volatile storage system of claim 17, wherein the one or more control circuits are configured to:

program a different group of the memory cells that are connected to the selected word line in the selected sub-block; and sense the different group of the memory cells for the default sense time while applying the read reference voltage to the selected word line.

19. The non-volatile storage system of claim 15, wherein the one or more control circuits are configured to:

verify the group of the memory cells that are connected to the selected word line in the selected sub-block as a condition to pass programming the group of the memory cells.

20. The non-volatile storage system of claim 15, wherein the one or more control circuits are configured to:

program the group of the memory cells that are connected to the selected word line in the selected sub-block without verify, wherein a same number of program pulses are applied to each memory cell being programmed to a given data state.

\* \* \* \* \*